(12) United States Patent
Dozoretz et al.

(10) Patent No.: US 6,197,119 B1
(45) Date of Patent: Mar. 6, 2001

(54) METHOD AND APPARATUS FOR CONTROLLING POLYMERIZED TEOS BUILD-UP IN VACUUM PUMP LINES

(75) Inventors: Paul Dozoretz, Evergreen; Youfan Gu, Boulder, both of CO (US)

(73) Assignee: MKS Instruments, Inc., Andover, MA (US)

(*) Notice: Subject to any disclaimer, the term of this patent is extended or adjusted under 35 U.S.C. 154(b) by 0 days.

(21) Appl. No.: 09/250,928

(22) Filed: Feb. 18, 1999

(51) Int. Cl.[7] .......................... C23C 16/00; H01L 21/00; B01D 24/00

(52) U.S. Cl. ..................... 118/715; 438/905; 55/522; 55/525

(58) Field of Search ................ 118/715; 438/905; 95/45, 56, 902; 55/522, 525, 527; 216/100, 101, 94, 95, 75, 1, 2

(56) References Cited

U.S. PATENT DOCUMENTS

| | | | |
|---|---|---|---|
| 1,920,800 | 8/1933 | McCausland | 257/247 |
| 3,785,121 | 1/1974 | Phelps | 55/53 |
| 3,802,497 | 4/1974 | Kümmell et al. | 165/158 |
| 3,865,929 | 2/1975 | Ehlig | 423/488 |
| 3,910,347 | 10/1975 | Woebcke | 165/142 |
| 3,956,061 | 5/1976 | Young et al. | 159/48 |
| 4,374,811 | 2/1983 | Karger et al. | 423/240 |
| 4,613,485 | 9/1986 | Parry et al. | 422/173 |
| 4,739,787 | 4/1988 | Stoltenberg | 137/14 |
| 5,048,601 | 9/1991 | Yamaguchi et al. | 165/140 |
| 5,141,714 | 8/1992 | Obuchi et al. | 422/174 |
| 5,161,605 | 11/1992 | Gutlhuber | 165/1 |
| 5,405,445 | 4/1995 | Kumada et al. | 118/719 |
| 5,422,081 | 6/1995 | Miyagi et al. | 422/170 |
| 5,728,602 | 3/1998 | Bellows et al. | |
| 5,776,216 | 7/1998 | Yang | 55/385.1 |
| 5,800,616 | 9/1998 | Persyn | 118/719 |
| 5,814,377 | 9/1998 | Robles et al. | 527/579 |
| 5,817,566 | 10/1998 | Jang et al. | 438/424 |

(List continued on next page.)

FOREIGN PATENT DOCUMENTS

| | | | |
|---|---|---|---|
| 1-218013 | 8/1989 | (JP) . | |
| 1-318231 | 12/1989 | (JP) . | |
| 2-25573 | 1/1990 | (JP) . | |
| 2-9408 | 1/1990 | (JP) . | |
| 2-59002 | 2/1990 | (JP) . | |
| 2-61067 | 3/1990 | (JP) . | |
| 2-111403 | 4/1990 | (JP) . | |
| 3-229609 | * 10/1991 | (JP) | C23C/16/44 |
| 4-150903 | 5/1992 | (JP) . | |

OTHER PUBLICATIONS

"Foreline Traps," *Nor–Cal Products*, Nor–Cal Products, Inc., May 1990.

"Vacuum Inlet Traps and Oil Mist Eliminators," MV Products, A Division of Mass–Vac, Inc.

Primary Examiner—Gregory Mills
Assistant Examiner—P. Hassanzadeh
(74) Attorney, Agent, or Firm—James R. Young; Chrisman, Bynum & Johnson

(57) ABSTRACT

A TEOS trap for controlling TEOS polymerization from reaction furnace effluent in a vacuum pump line a $SiO_2$ CVD process includes a molecular species-selective flow impeding medium that adsorbs and retains TEOS and water molecules from the effluent long enough to consume substantially all the water molecules in TEOS hydrolysis reactions while allowing non-hydrolyzed TEOS, ethylene, and other gaseous byproducts to pass through the trap and retaining solid and liquid phase $SiO_2$-rich TEOS polymers formed by the hydrolysis reactions in the trap for subsequent removal and disposal. The molecular species-selective flow impeding medium has a plurality of adsorption surfaces to make a surface density that performs the TEOS and water flow impeding fuction and solid and liquid phase TEOS polymer trapping function.

10 Claims, 14 Drawing Sheets

U.S. PATENT DOCUMENTS

| | | | |
|---|---|---|---|
| 5,817,578 | 10/1998 | Ogawa | 438/714 |
| 5,820,641 | 10/1998 | Gu et al. | 55/269 |
| 5,827,370 | 10/1998 | Gu | 118/715 |
| 5,830,279 | 11/1998 | Hackenberg | 134/1.1 |
| 5,834,846 | 11/1998 | Shinriki et al. | 257/754 |
| 5,855,651 * | 1/1999 | Kurita et al. | 95/280 |
| 5,883,425 | 11/1998 | Jeon et al. | 414/217 |

* cited by examiner

METHOD AND APPARATUS FOR CONTROLLING POLYMERIZED TEOS BUILD-UP IN VACUUM PUMP LINES

BACKGROUND OF THE INVENTION

1. Field of the Invention

This invention is generally related to controlling build-up of polymerized TEOS in vacuum pump lines, valves, and other components downstream from a silicon dioxide deposition chamber, and more particularly to a trap containing a molecular species-selective flow impeding medium for adsorbing and retaining TEOS and water molecules long enough to consume substantially all the water molecules in hydrolysis of TEOS while allowing non-hydrolyzed TEOS, ethylene, and other gaseous byproducts in the effluent to pass through the medium and while trapping solid and liquid phase polymerized TEOS formed by the hydrolysis reactions for later removal and disposal.

2. Description of the Prior Art

Thin films of silicon dioxide ($SiO_2$) are deposited on silicon wafers and other substrates for semiconductor devices with chemical vapor deposition (CVD) processes in which a source material comprising silicon and oxygen atomic species are reacted in a vacuum chamber to produce the silicon dioxide. As described in detail in U.S. Pat. No. 5,827,370, which is incorporated herein by reference, tetra-ethylorthosilicate or tetraethoxysilane gas ($Si(OC_2H_5)_4$), also known as TEOS, is often used as the source material because of its excellent trench/via filling capability, low particle level, and resulting high filling quality for semiconductor devices. TEOS also has a high auto-ignition temperature, which makes it safer to use than silane gases.

In a typical CVD process, a vacuum pump is connected to a reaction chamber, the silicon wafer or other substrate is positioned in the chamber, and the chamber is evacuated and heated. A feed gas comprising the TEOS is then fed into the evacuated reaction chamber, where some of the TEOS is disassociated by pyrolysis into its atomic species, which recombine as $SiO_2$ and other molecules, including water vapor ($H_2O$). $SiO_2$ deposits on the substrate, while the remaining partially polymerized TEOS, $H_2O$, and other gaseous molecules (primarily ethylene ($C_2H_4$) and any carrier or dilution gases, such as helium ($H_{e2}$) or nitrogen ($N_2$)) are drawn as effluent out of the reaction chamber by the vacuum pump. Oxygen ($O_2$) or ozone ($O_3$) are sometimes also used to reduce the reaction temperature in the furnace.

The vacuum pumps are connected to the reaction chambers by pipe sections called pump lines, and there are often one or more valves and other components in the pump lines between the reaction chambers and the vacuum pumps. The TEOS molecules are very unstable in the presence of the water vapor and hydrolyze easily into long polymer chains that form in the pump lines, clog valves and other components, and damage the vacuum pump.

The virtual wall provided by the gas boundary layer creating apparatus of U.S. Pat. No. 5,827,370, in which an elongated annular nozzle assembly provides a nitrogen ($N_2$) boundary layer between effluent TEOS, water vapor, and other by-products of the reaction chamber, is effective to move those effluent byproducts away from the reaction chamber and further downstream in the pump line before the TEOS and water vapor polymerize on interior surfaces of the pump line. However, such polymerized materials (solidified or liquefied TEOS polymer) still have to be removed before they reach the vacuum pump and any valves or other components in the pump line that can be clogged and/or damaged by such materials. Various traps have been tried for such removal. The U.S. Pat. No. 5,827,370 indicates such a trap in a generic manner downstream from the virtual wall or boundary layer apparatus in that patent. However, such traps have not been very satisfactory, due to either clogging too fast, not effectively removing the TEOS and water vapor molecules, or both, and they are very difficult, if not impossible, to clean, yet expensive and time consuming to replace. Consequently, there is still far too much down time, labor, and expense incurred in dealing with the problems created by polymerized TEOS downstream from the reaction chamber.

SUMMARY OF THE INVENTION

Accordingly, it is a general object of the present invention to decrease time, labor, and costs required to deal with polymerized TEOS downstream from the reaction chamber in $SiO_2$ thin film deposition systems in which TEOS is used as the source gas.

It is also an object of this invention to provide an improved method and apparatus for removing polymerized TEOS from the pump line upstream of the vacuum pump.

A more specific object of the present invention is to facilitate formulation of polymerized TEOS in the pump line for removal upstream of the vacuum pump.

A still more specific object of the invention is to facilitate hydrolyzing TEOS molecules to consume substantially all available water vapor in the effluent upstream from the vacuum pump so that TEOS remaining in the reaction chamber effluent that reaches the vacuum pump cannot be polymerized to form on vacuum pump components and interior surfaces.

Another specific object of the invention is to provide a trap for polymerized TEOS that is easy and inexpensive to clean with minimal down time and labor.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the method of the present invention may comprise adsorbing and retaining TEOS and water molecules from the reaction furnace effluent on adsorption surfaces for enough time to consume substantially all the water molecules in TEOS hydrolysis reactions while allowing non-hydrolyzed TEOS, ethylene, and other non-polar gaseous byproducts in the effluent to continue and retaining solid and/or liquid phase $SiO_2$-rich polymerized TEOS formed by the hydrolysis reactions in a trap. The apparatus for achieving the foregoing and other objects in accordance with this invention may comprise a TEOS trap with a molecular species-selective flow impeding medium that adsorbs polar TEOS and water molecules and does not adsorb non-polar ethylene and other non-polar molecules. A preliminary stage can also be used to capture and retain solid and/or liquid phase TEOS polymers in a reservoir under a primary stage that contains the molecular species-selective flow impeding medium. The apparatus of the invention also includes preferred and other embodiments of the molecular species-selective flow impeding medium that provide adsorption surface densities and turbulence creating materials and structures that enhance hydrolysis and resulting polymerization of TEOS in the TEOS trap.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

IN THE DRAWINGS

Figure 1:
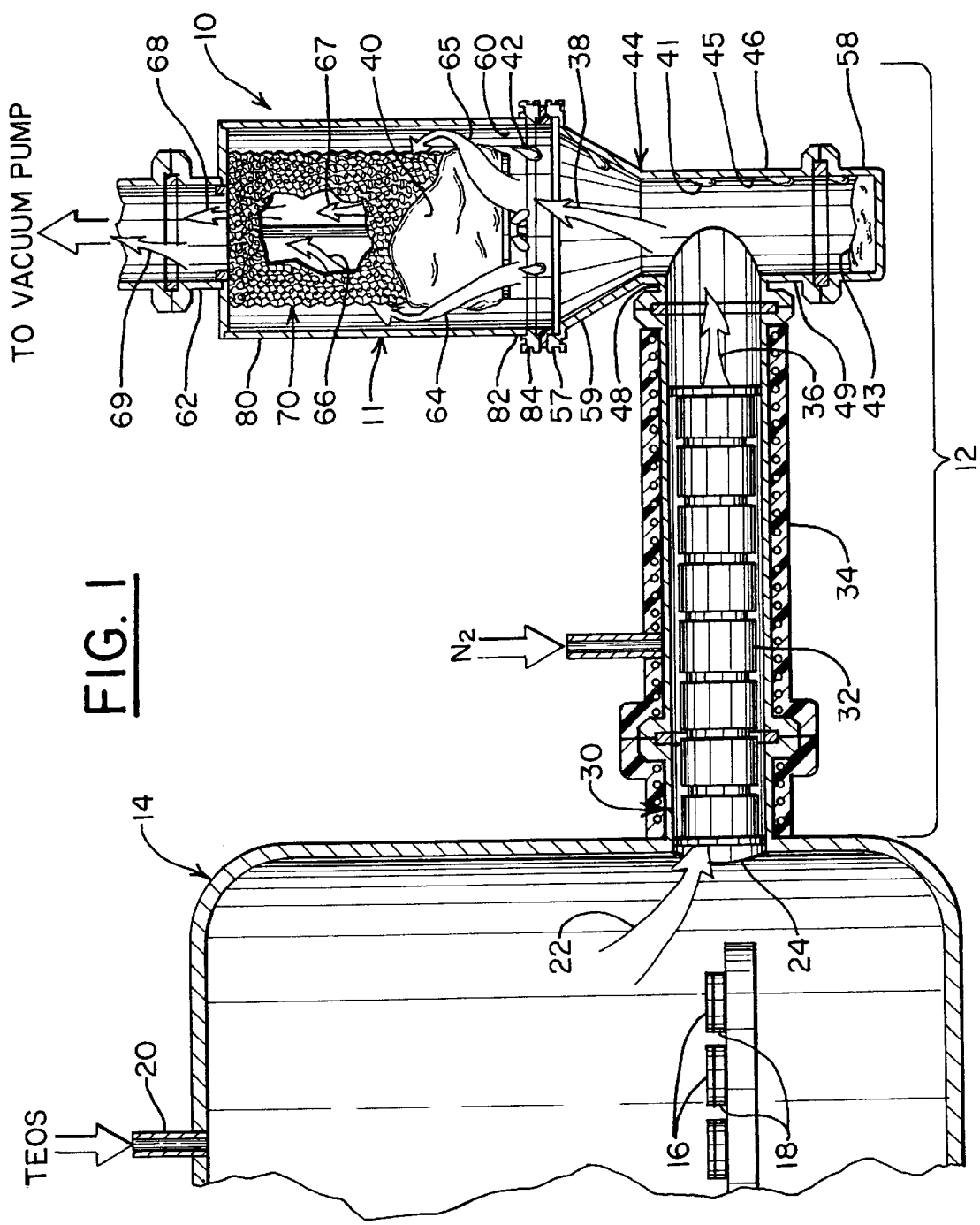
Figure 2:
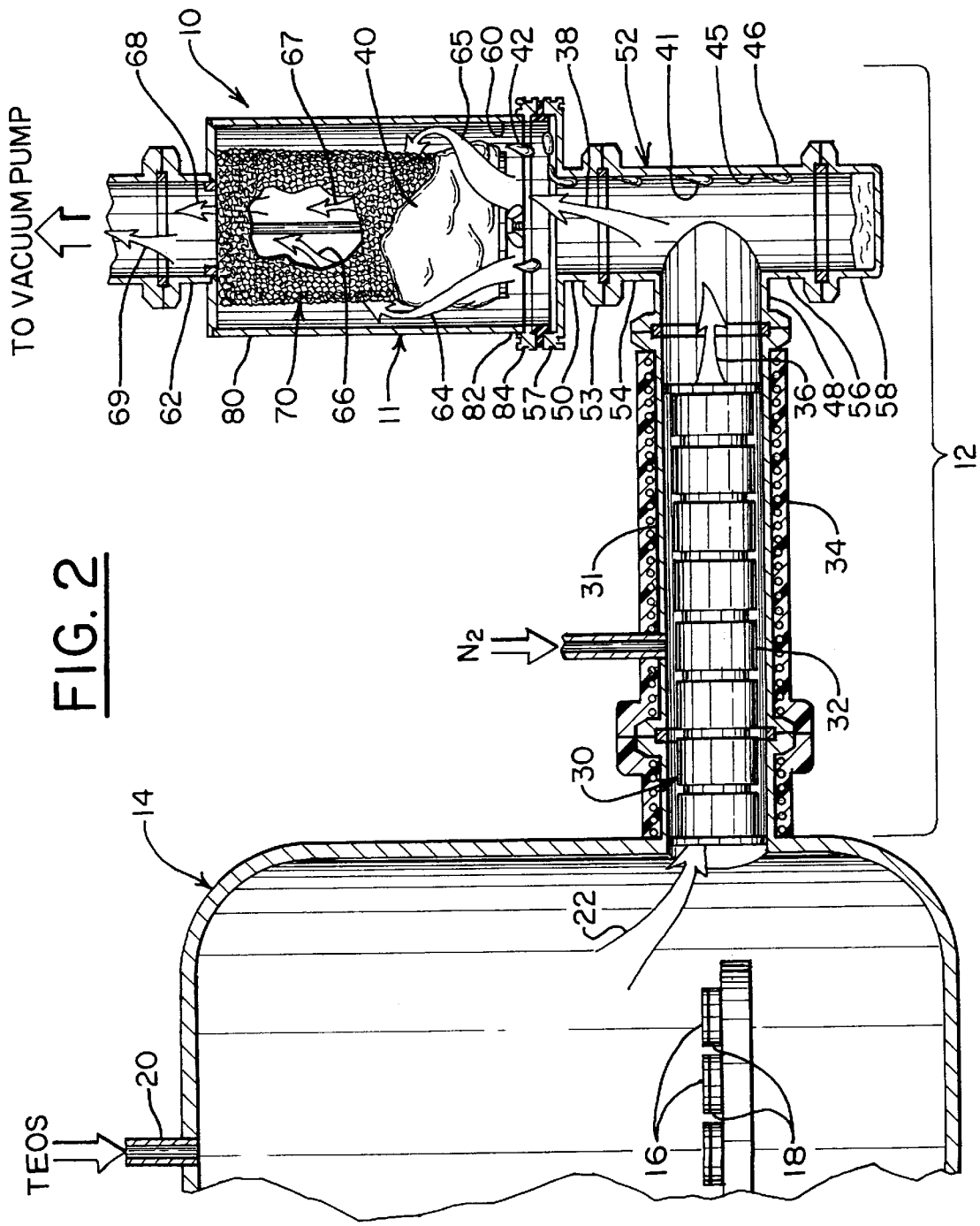
Figure 3:
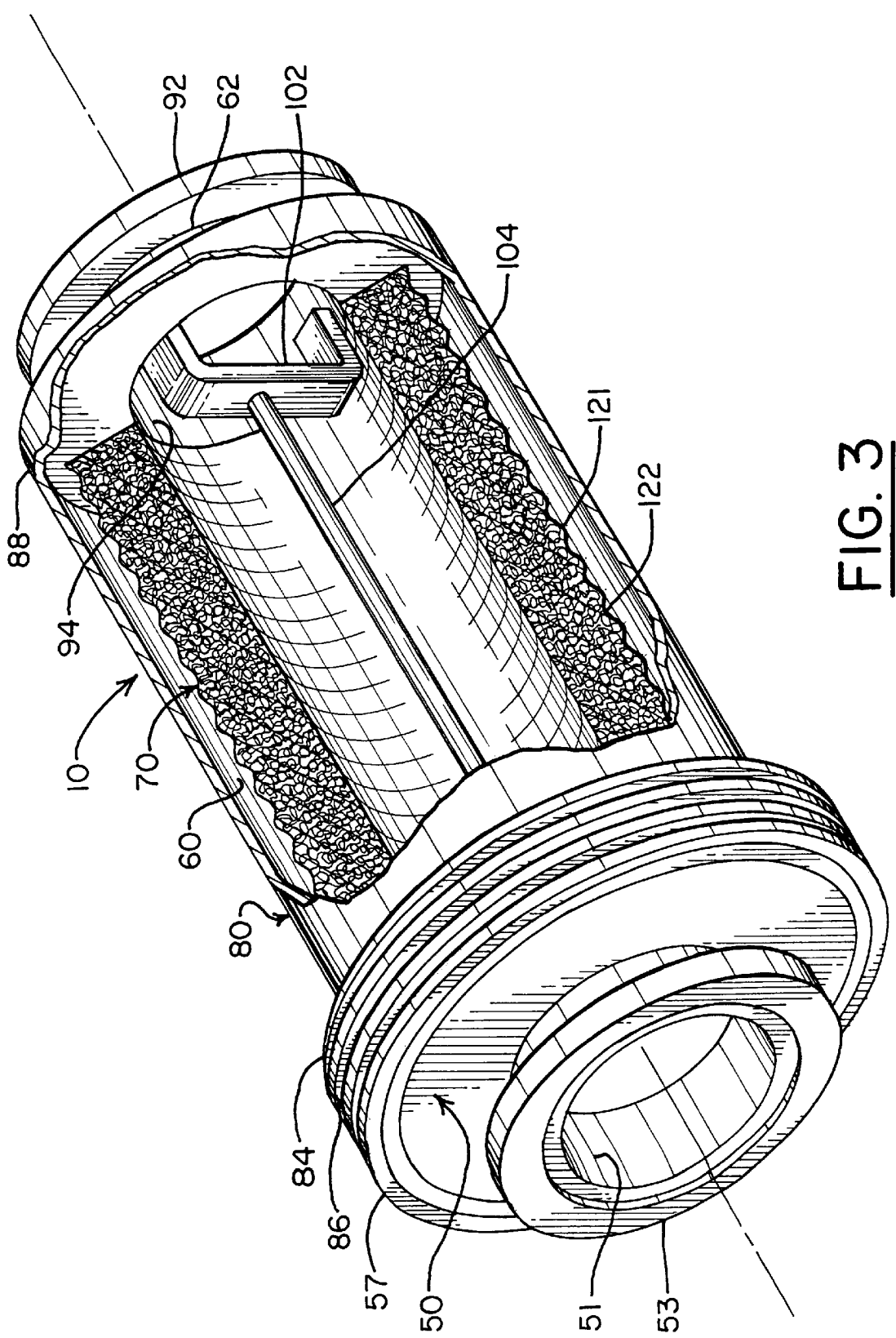
Figure 4:
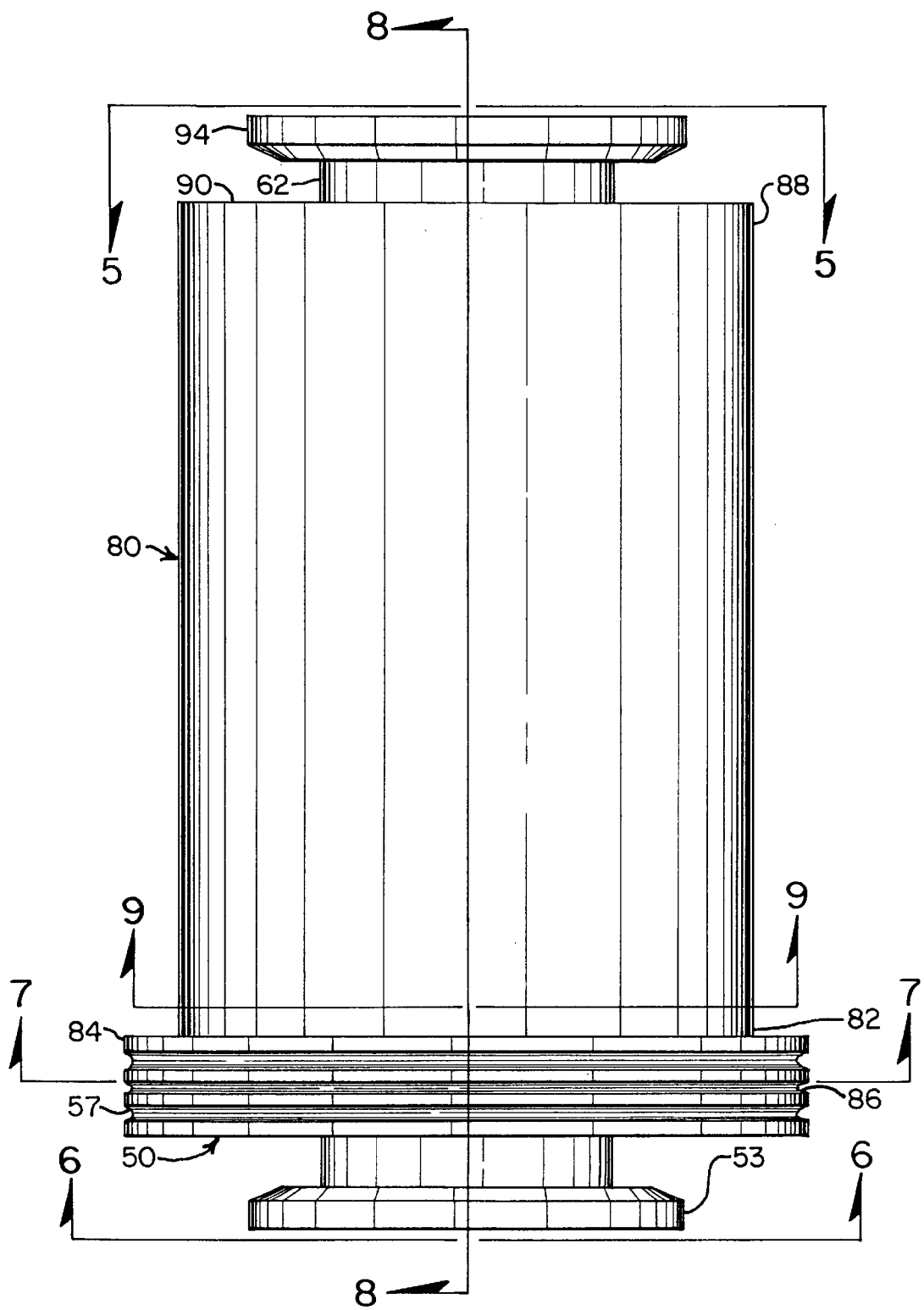
Figure 5:
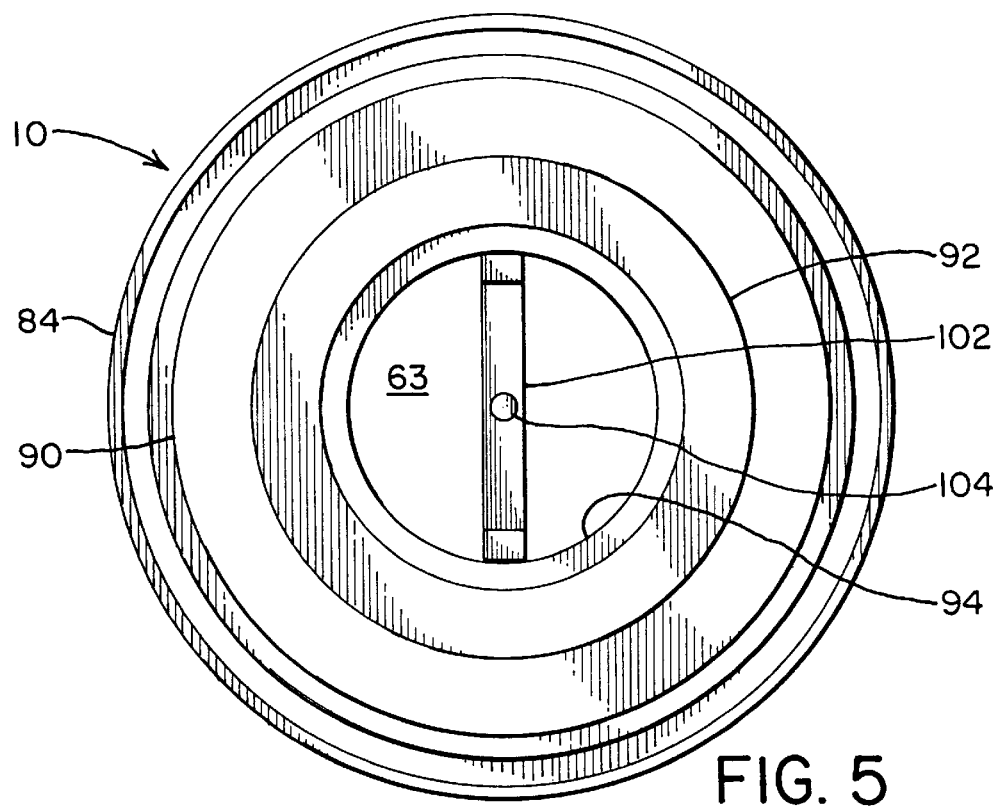
Figure 6:
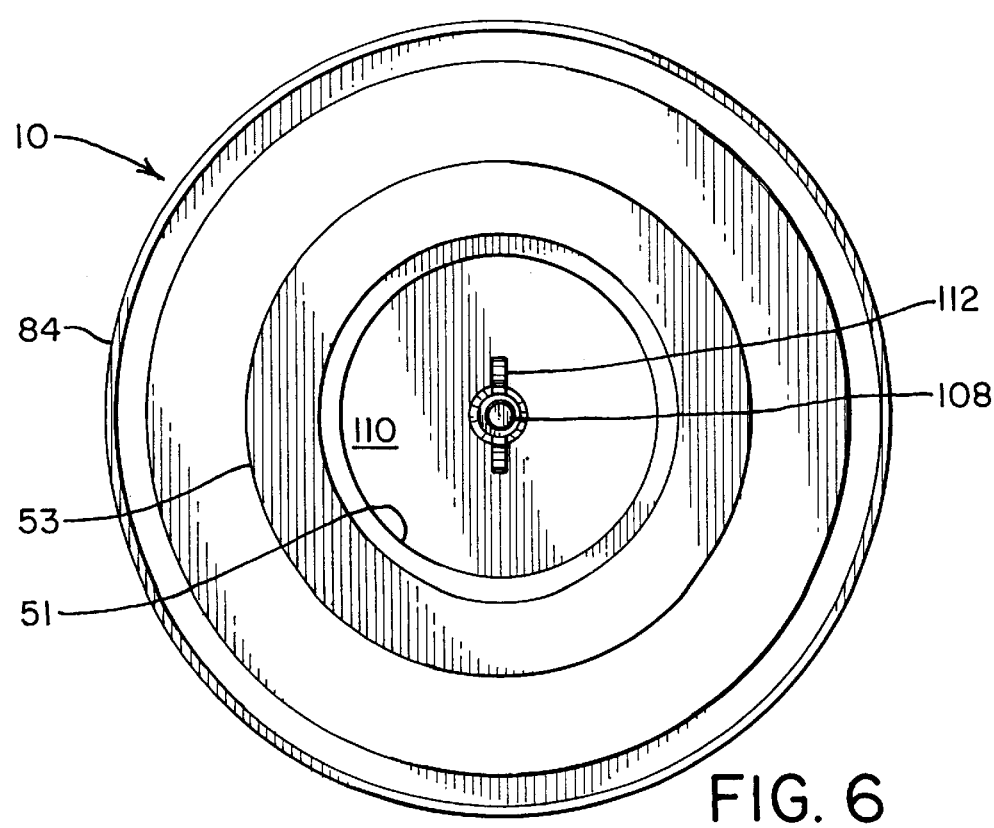
Figure 7:
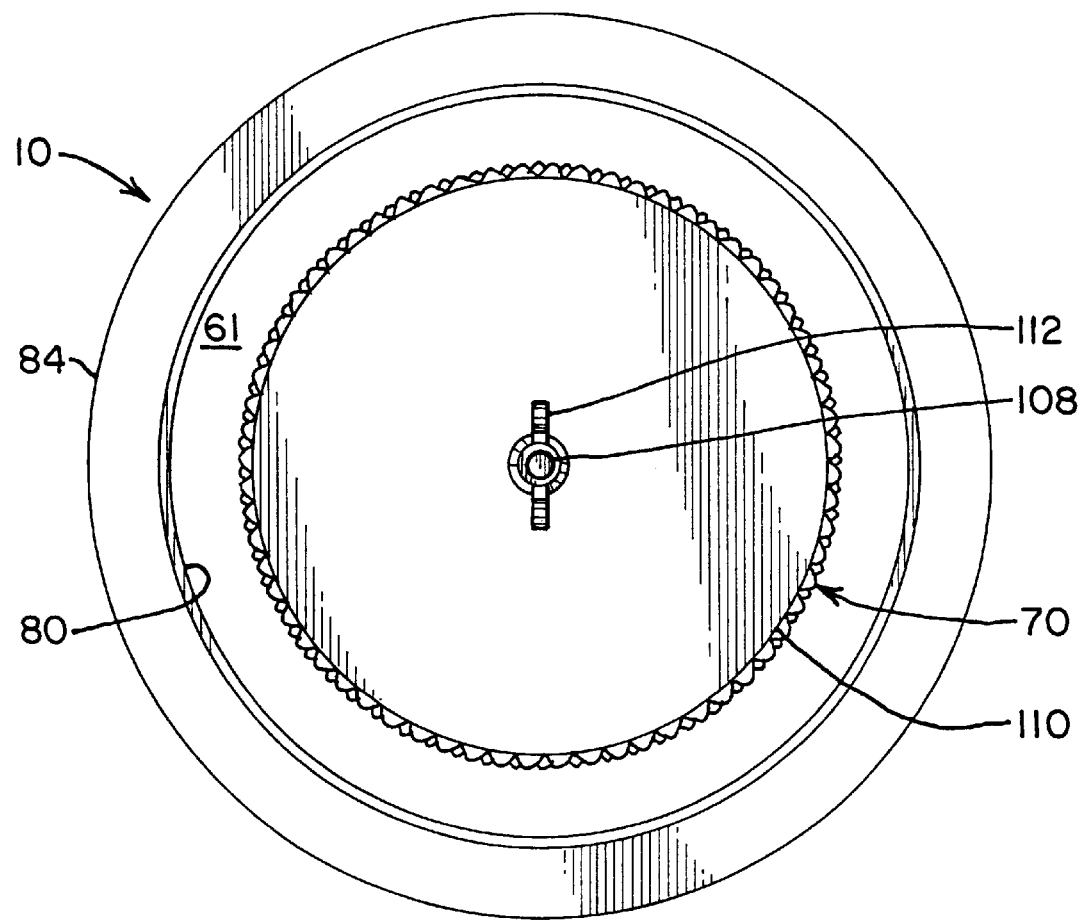
Figure 8:
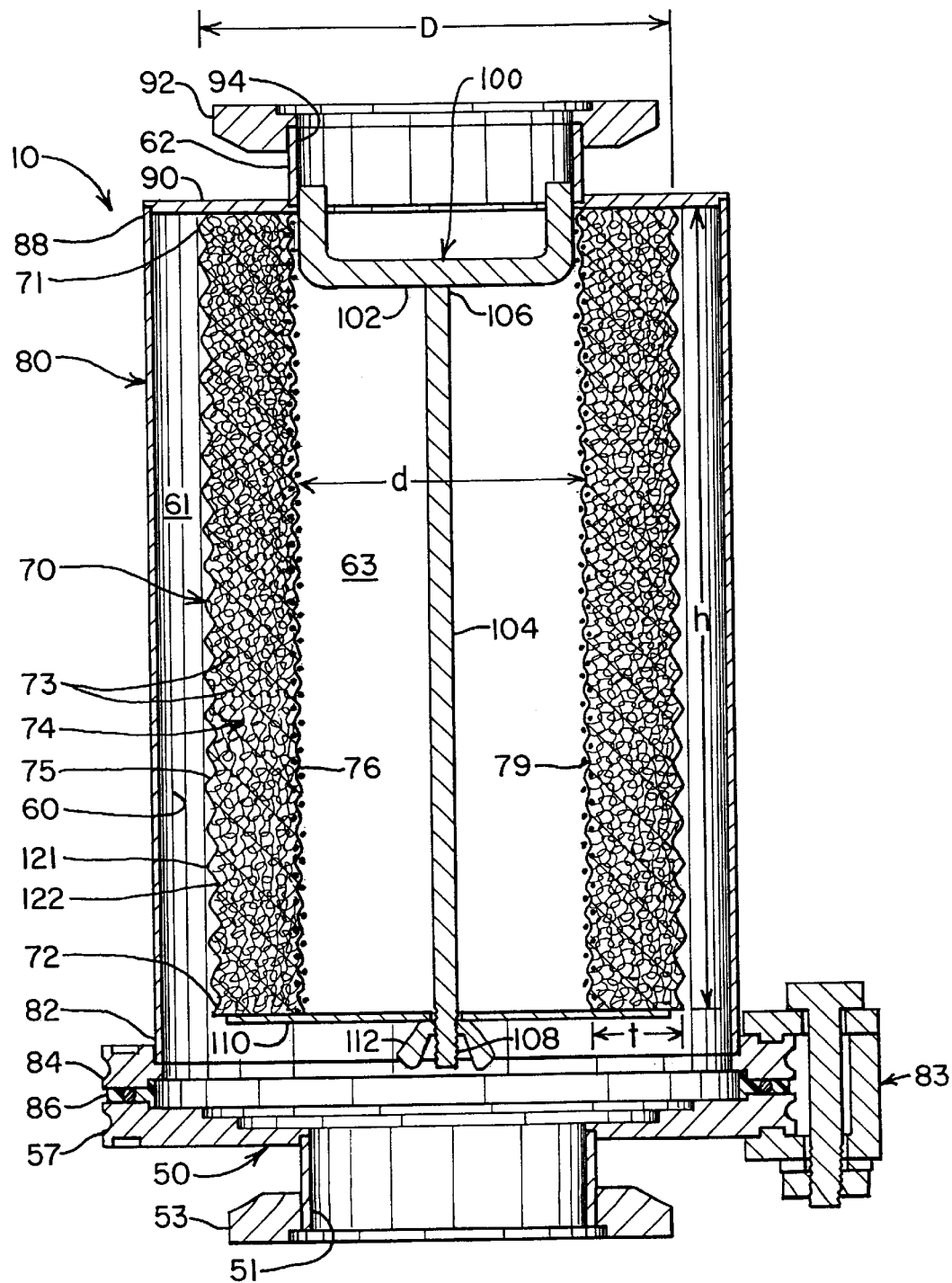
Figure 9:
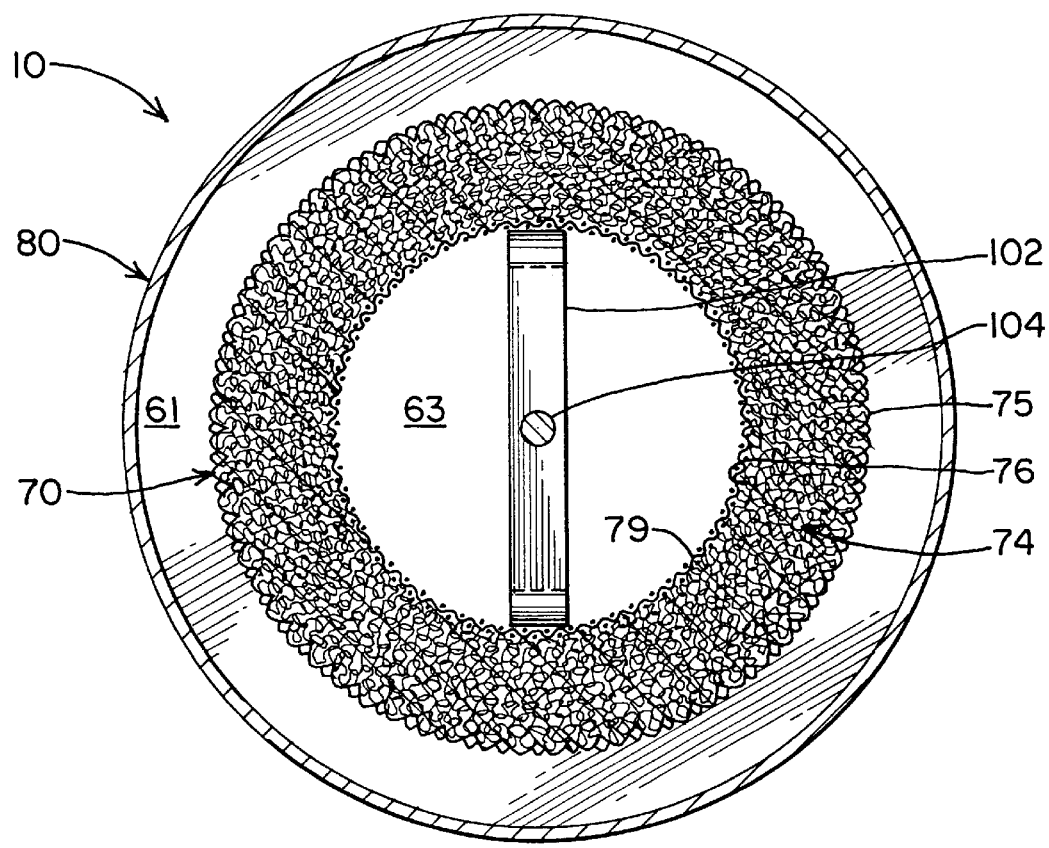
Figure 15:
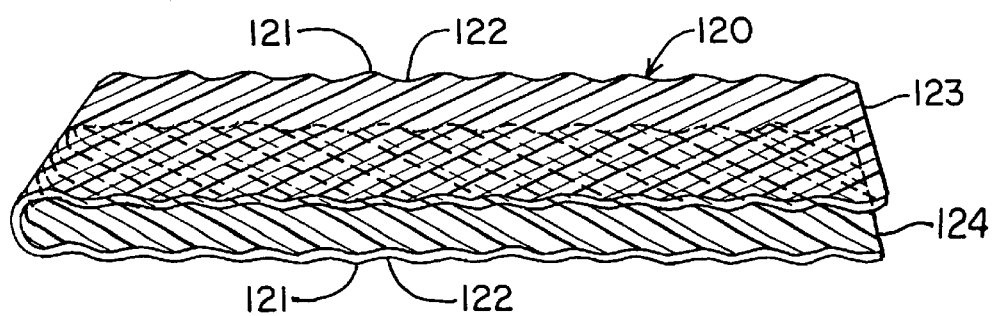
Figure 10:
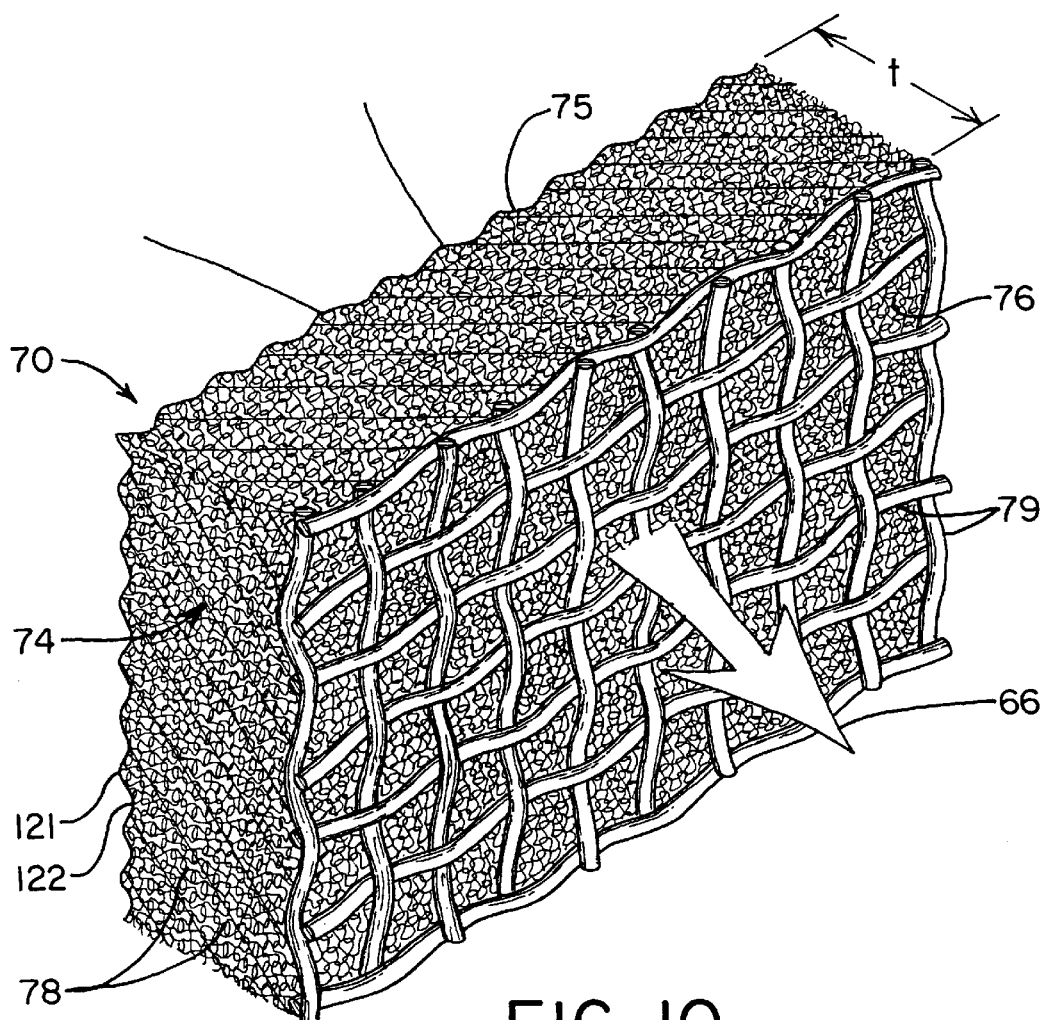
Figure 11:
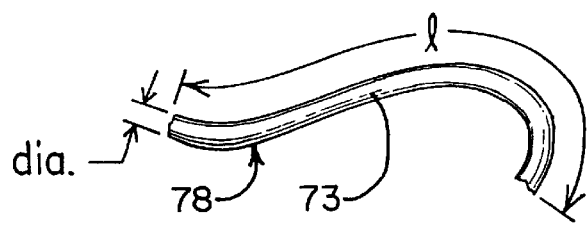
Figure 12:
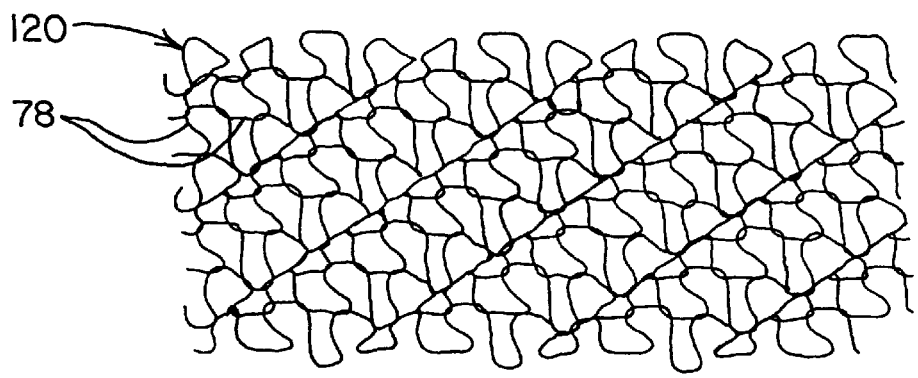
Figure 13:
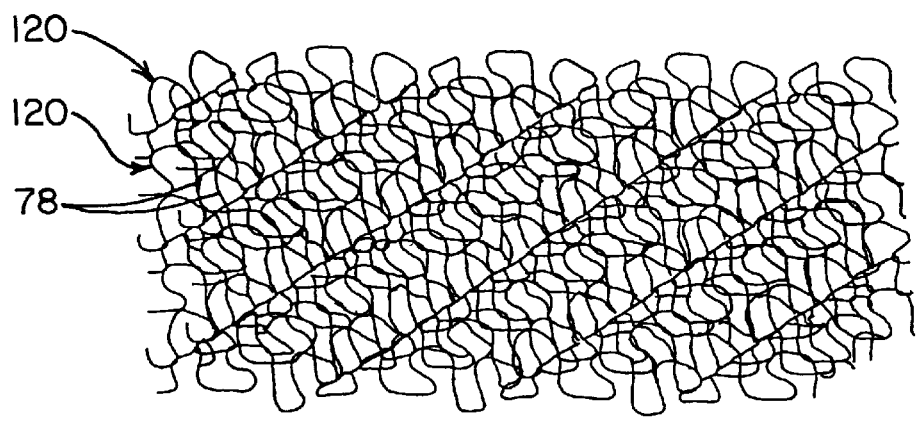
Figure 14:
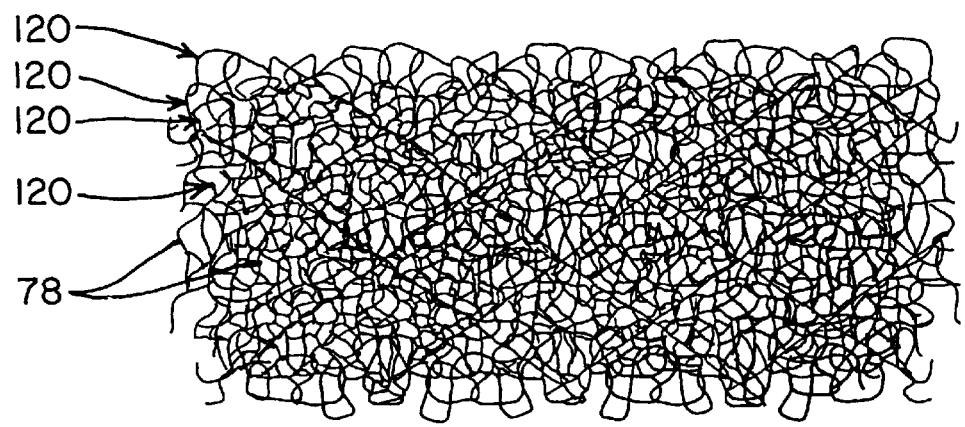
Figure 16:
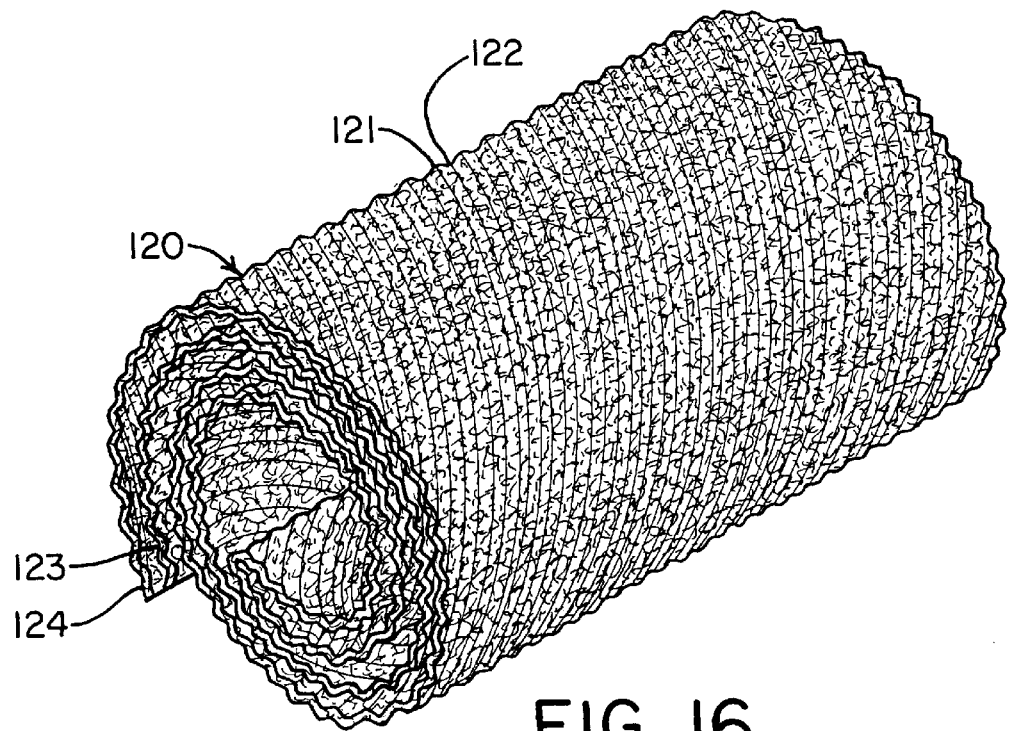
Figure 17:
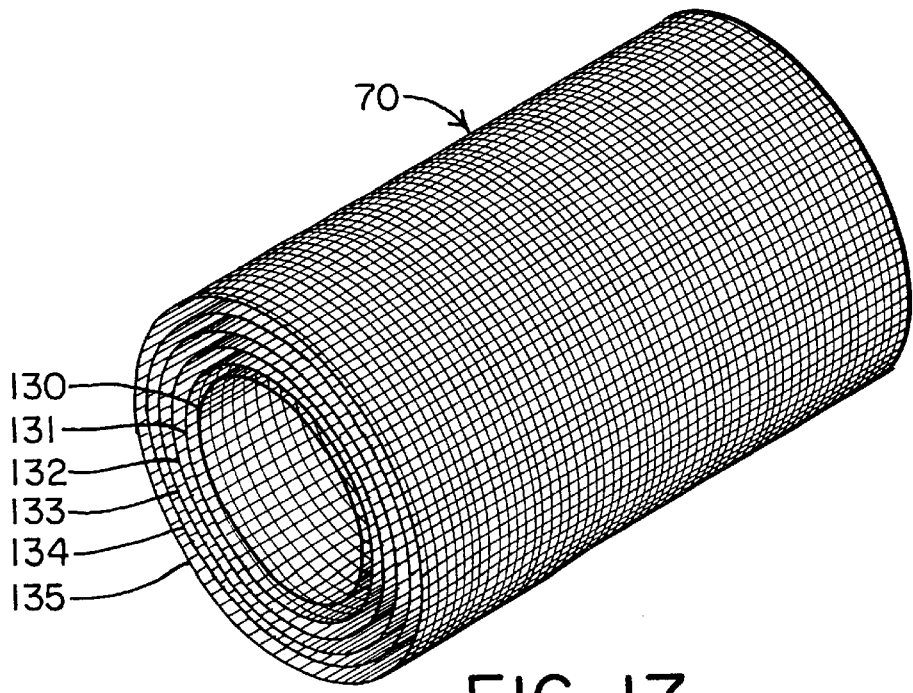
Figure 18:
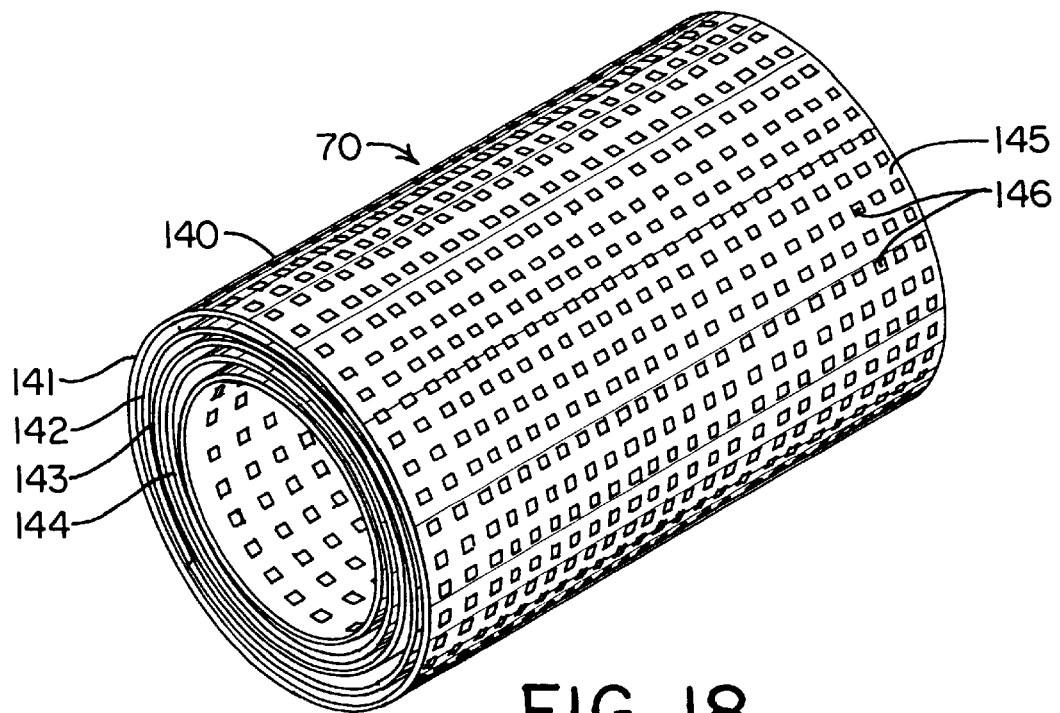
Figure 19:
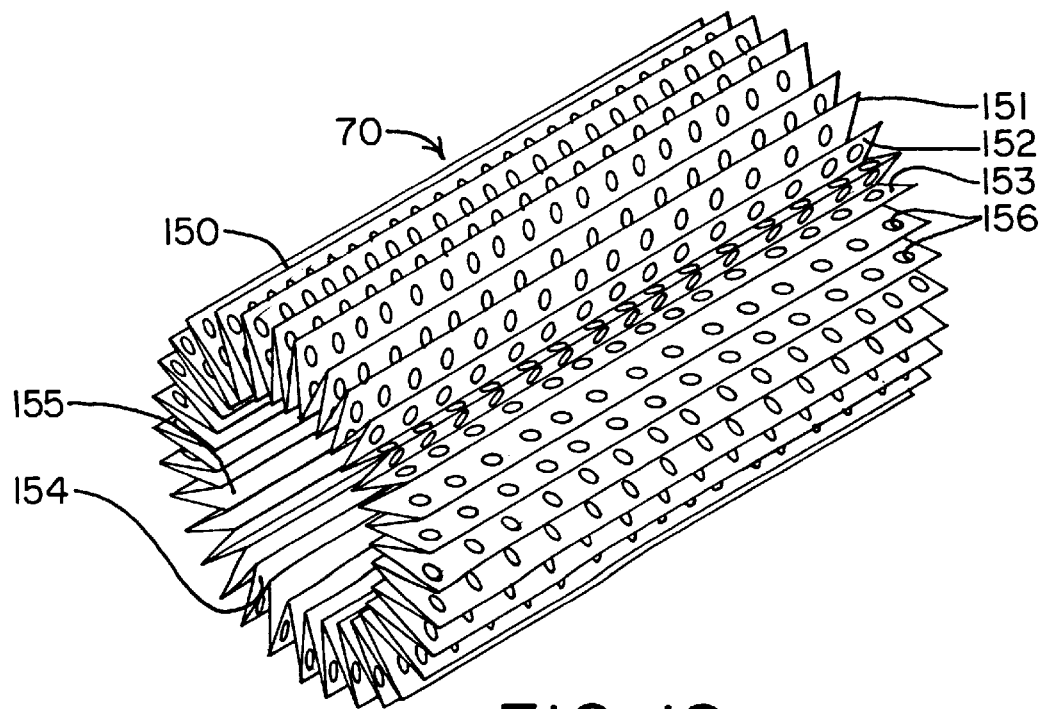
Figure 20:
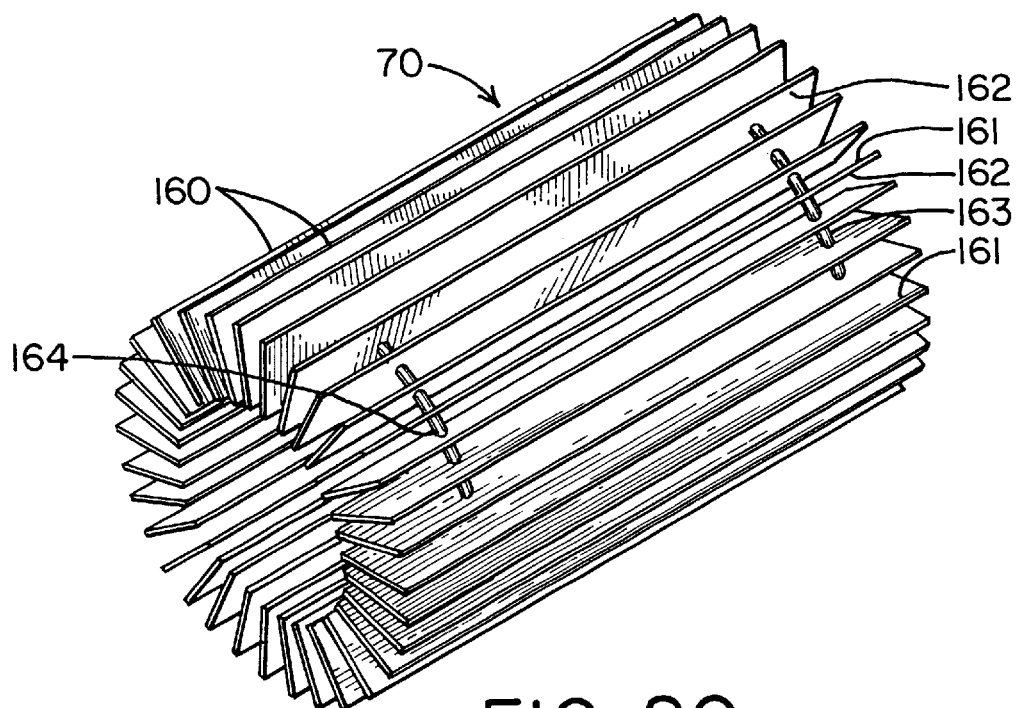
Figure 21:
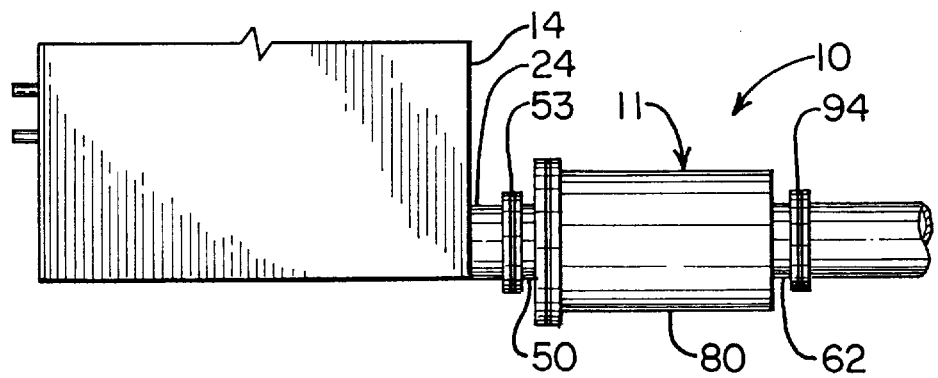
Figure 22:
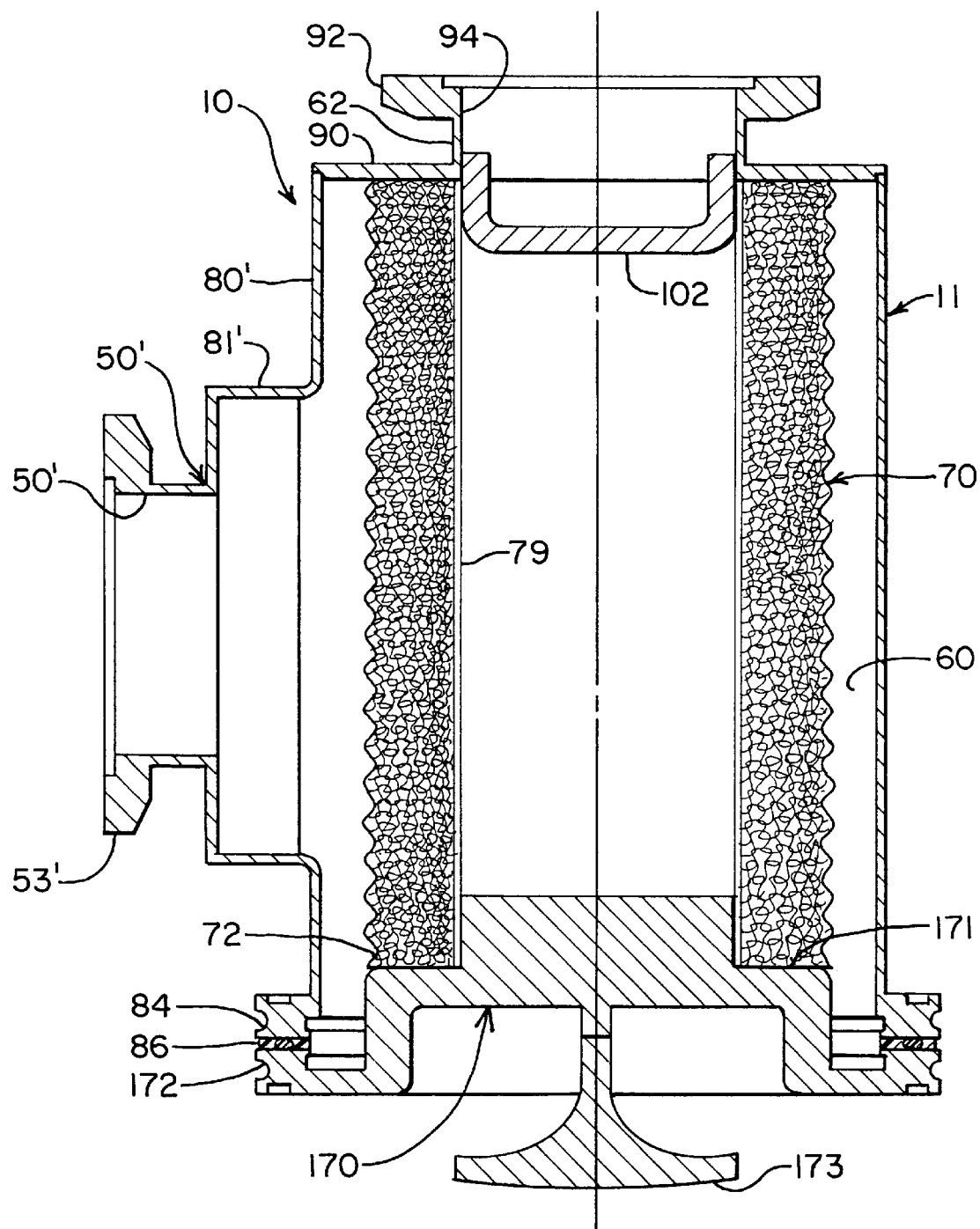

FIG. 1 is a diagrammatic view in cross-section of a preferred embodiment of the TEOS trap of the present invention in a preferred mounting in a pump line of silicon dioxide deposition reaction chamber;

FIG. 2 is a diagrammatic view in cross-section of a variation of the preferred embodiment of the TEOS trap of FIG. 1 in which the preliminary stage is provided by common pipe T-fitting instead of a specially shaped and fabricated preliminary stage;

FIG. 3 is an isometric view of the primary stage of the preferred embodiment TEOS trap shown in FIG. 2 with a portion of the housing cut away to reveal the molecular species-selective flow impeding medium, and with a portion of the molecular species-selective flow impeding medium cut away to reveal the inner core and retaining apparatus;

FIG. 4 is an elevation view of the primary stage of the TEOS trap shown in FIGS. 2 and 3;

FIG. 5 is a top plan view of the TEOS trap shown in FIGS. 2 and 3, as indicated by line 5—5 in FIG. 4;

FIG. 6 is a bottom plan view of the TEOS trap shown in FIGS. 2 and 3, as indicated by line 6—6 in FIG. 4;

FIG. 7 is a cross-sectional view of the TEOS trap taken along section line 7—7 of FIG. 4, which is how a bottom view of the trap appears with the bottom end cap removed;

FIG. 8 is a vertical cross-sectional view of the TEOS trap taken along section line 8—8 of FIG. 4;

FIG. 9 is a transverse cross-sectional view of the TEOS trap taken along section line 9–9 of FIG. 4;

FIG. 10 is an isometric view of a section of a preferred molecular species-selective flow impeding medium according to the present invention;

FIG. 11 is an enlarged view of a segment of a wire in the preferred embodiment mesh molecular species-selective flow impeding medium shown in FIGS. 1, 2, 8, and 10;

FIG. 12 is an elevation view of a single layer of an interlaced metal fabric mesh used in the preferred embodiment molecular species-selective flow impeding medium according to this invention;

FIG. 13 is an elevation view of two layers of the interlaced metal fabric mesh of FIG. 11 laminated together;

FIG. 14 is an elevation view of four layers of the interlaced metal fabric mesh of FIG. 11 laminated together;

FIG. 15 is a diagrammatic view of a strip of the interlaced metal fabric mesh of FIG. 11 folded over on itself to make two layers laminated together;

FIG. 16 is a diagrammatic perspective view of a sheet of interlaced metal fabric folded as illustrated in FIG. 15 and then rolled that makes four layers laminated together in a cylinder to illustrate a technique for fabricating multiple layers of the interlaced metal fabric in a cylindrical shape for the molecular species-selective flow impeding medium of this invention;

FIG. 17 is a diagrammatic isometric view of an alternate embodiment molecular species-selective flow impeding medium comprised of multiple cylindrical layers of metal screen laminated together;

FIG. 18 is a diagrammatic isometric view of another alternate embodiment molecular species-selective flow impeding medium comprised of multiple cylindrical layers of perforated metal foil laminated together;

FIG. 19 is a diagrammatic isometric view of another alternate embodiment molecular species-selective flow impeding medium comprised of a perforated and folded metal foil sheet that is formed into a cylindrical shape;

FIG. 20 is a diagrammatic isometric view of another alternate embodiment molecular species-selective flow impeding medium comprised of a plurality of elongated metal foil leaves oriented radially in a cylindrical shape;

FIG. 21 is a diagrammatic elevational view of the primary stage TEOS trap of FIG. 3 mounted in an alternate manner in a pump line without the preliminary stage of FIG. 2; and FIG. 22 is a vertical cross-sectional view of an alternate embodiment TEOS trap according to the present invention.

DETAILED DESCRIPTION OF THE PREFERRED EMBODIMENTS

A TEOS trap 10 according to the present invention is shown diagrammatically in FIG. 1 as it would be used mounted in a pump line 12, sometimes called a foreline, of a vacuum system for a low pressure chemical vapor deposition (LP CVD) chamber or furnace 14 in which thin films 16 of semiconductor silicon dioxide ($SiO_2$) are deposited onto substrates 18 in production of semiconductor devices. In such processes, a vacuum pump (not shown in FIG. 1) is connected to the pump line 12 and used to evacuate the LP CVD furnace 14 to a very low pressure and to maintain such vacuum in the furnace 14 in a range typically of about 100–500 mtorr, often about 150 mtorr, throughout the $SiO_2$ deposition process. The interior of the furnace 14 is also heated to at least 650° C., usually to a temperature of about 650–750° C. at which TEOS molecules can be pyrolyzed, or oxidized. Therefore, as TEOS gas is fed through feed gas inlet 20 into the 100–500 mtorr vacuum 650–750° C. furnace 14, it pyrolyzes into its atomic species or reacts with oxygen, and a series of hydrolysis reactions occur to form the thin film 16 of $SiO_2$ on the substrates 18.

However, not all of the TEOS gets decomposed or hydrolyzed to $SiO_2$ on the substrates 18 or even in the furnace 14. Because the vacuum pump must operate continuously to maintain the vacuum as new TEOS flows into the feed gas inlet 20, substantial amounts of the TEOS molecules (most of them are partially polymerized) as well as water vapor ($H_2O$) and other molecules created in the pyrolysis/oxidization reaction are drawn out of the furnace 14, as indicated by flow arrow 22, and into the pump line 12 of the vacuum system. Hydrolysis of the TEOS and formation of $SiO_2$ does not end at the gas outlet 24 of the furnace 14. On the contrary, the hydrolysis continues in the pump line 12 and can cause build-up of polymerized TEOS molecules in the pump line 12, which, if not checked, can clog the pump line 12 as well as other components, such as pressure gauges (not shown) and valves (not shown) that are often needed in the pump line 12 for monitoring and control purposes. It should be noted that the polymerized TEOS can be formed in gas, liquid, or even solid forms depending upon the chain length of the polymerized molecules. In addition, if such a polymerization (hydrolysis) reaction occurs inside the vacuum pump, the life of the pump can be reduced significantly.

The TEOS trap 10 is designed to prevent such build-up of $SiO_2$-rich polymerized TEOS in the pump line 12 as well as in pressure gauges, valves, other components, and in the vacuum pump, by creating ideal conditions for such build-up 40 of SiO$_2$-rich polymerized TEOS in the trap 10, thereby removing the gaseous mixture of TEOS molecules and water vapor in the furnace effluent flow 22 from the pump line 12 before it can cause problems farther downstream. The TEOS trap 10 is particularly effective when used in combination with the virtual wall insert 30 of U.S. Pat. No. 5,827,370, which is effective to conduct the effluent flow 22 away from the furnace outlet 24 without deposition or build-up in or near the outlet 24. However, such a virtual wall or boundary layer apparatus 30 is not necessary to the structure or function of the TEOS trap 10 of this invention.

A preferred, albeit not essential, mounting for the TEOS trap 10 of this invention in a pump line 12 is illustrated in FIG. 1, wherein the TEOS trap 10 is shown with a primary stage trap apparatus 11 in which the most effective and complete TEOS removal occurs mounted on a preliminary stage trap apparatus 44, which is effective to remove and/or hold some of the less reacted TEOS polymer materials 42 that tend to be more liquid phase than solid, as will be described in more detail below. Essentially, however, the primary stage 11 contains a molecular species-selective flow impeding medium 70 with many micro-surfaces (described in more detail below) that selectively impede flow of TEOS and water vapor while allowing ethylene and other molecules in the effluent to pass unimpeded through the medium 70 and that provide nearly ideal surface conditions for hydrolyzing TEOS, which grows or builds up in liquid and solid phases on the surfaces in the medium 70, as illustrated by the build-up 40 in FIG. 1. The preliminary stage 44 also has some large interior surfaces 45 on which some of such polymer TEOS build-up can occur, although the principal function of the preliminary stage 44 is to collect not only liquid and/or solid phase TEOS polymer materials 41 that hydrolyze on the interior surfaces 45 of the preliminary stage 44, but also liquid phase TEOS polymer material 42 that drips off the molecular species-selective flow impeding medium 70 in a manner that does not clog the trap 10. Such liquid phase TEOS polymer material 43 collects in the reservoir 58 attached to the bottom of the tube 46. Therefore, while the preliminary stage 44 is not essential to the effective operation of the primary stage 11 according to this invention, it increases the capacity of the TEOS trap dramatically.

The preliminary stage 44 of the TEOS trap 10, as shown in FIG. 1, can have a vertical tube section 46 and an upwardly diverging section 59 that functions as an inlet for the primary stage 11. An inlet 48 for the preliminary stage 44 enters the preliminary stage 44 on a horizontal axis that is substantially perpendicular to the vertical axis of the tube section 46. The reservoir 58 mounts on the lower end 49 of vertical tube section 46 for collecting and retaining mostly liquid polymer TEOS 43 that drips as indicated at 42 off the molecular species-selective flow impeding medium 70. A flange 57 around the top of the diverging section mates with a similar flange 84 around the bottom of the primary trap section 11 for mounting the primary trap stage 11 on the preliminary trap stage 44.

The preliminary stage 44 could be made in other structural variations. For example, the vertical tube 46 could have a larger diameter about equal to the diameter of the cylindrical housing 80 of the primary trap stage 11 so that the upwardly diverging section 59 would not be needed.

For more versatile assembly and mounting options, the TEOS trap 10 can be made as shown in FIG. 2 wherein the primary stage 11 had an inlet fitting 50 with a standard pipe connecting flange 53. The preliminary stage can be formed by a pipe T-fitting 52 with a horizontal inlet 48 that is connectable to the casing pipe section 31 that contains the virtual wall apparatus 30 and a vertical pipe section 46 that is connectable at its upper end 54 to the flange 53 of the inlet fitting 50 of the primary trap stage 11. A reservoir 58 can be attached to the lower end 56 of the T-fitting 52. As shown in FIG. 2, the inlet fitting 50 of the primary trap stage 11 is attached on the top end 54 of T-fitting 52 preferably oriented vertically so that liquid phase portions 42 of the polymerized TEOS build-up 40 on the molecular species-selective flow impeding medium can flow out of the trap chamber 60 and be caught in the reservoir 58 at the lower end 56 of the T-fitting 52. This T-fitting 52 mounting thereby prevents any of such liquid phase polymerized TEOS 42 formed in the TEOS trap 10 from flowing back into and clogging the virtual wall apparatus 30. This preliminary stage of the TEOS trap 10 formed easily and inexpensively by the T-fitting 52 increases the TEOS trap 10 capacity dramatically. Of course, if the virtual wall apparatus 30 is not used, the inlet 48 of the T-fitting 54 could be connected directly to the furnace outlet 24 or to some other pipe section or component in the pump line 12.

As mentioned above, the TEOS trap 10 is designed to provide ideal conditions for build-up of SiO$_2$ and polymerized TEOS. To appreciate the preferred TEOS trap 10 structure and operation, it is helpful to understand the unique nature and characteristics of TEOS deposition and build-up 40, which is much different than, for example, deposition or solidification of silicon nitride and other effluents of semiconductor fabrication processes for which traps of different structures and operating principles are available. Because of the unique nature and characteristics of TEOS deposition and build-up 40, the problems encountered in the pump line 12 and, more particularly, of trapping and preventing such build-up in the pump line 12 are unique. The depositions are different at different locations of the pump line 12. Hard, solid depositions tend to form immediately at the furnace outlet 24, followed by snowflake-like deposition a little farther from the furnace outlet, then shiny glassy crystal, which can be broken easily, and even liquid phase TEOS polymer farther from the furnace outlet 24.

Unlike the volatile by-products, such as ammonium chloride, that are found in silicon nitride LP CVD systems, depositions in a TEOS system pump line 12 are silicon dioxide-rich polymerized TEOS that cannot be sublimed with heat or solidified merely by removing heat, which is the operating principle used to trap, for example, ammonium chloride and other by-products common silicon nitride LP CVD processes. Therefore, traps, such as those described in U.S. Pat. No. 5,820,641, where cold water and a heat exchanger are used to cause deposition and trapping of the gaseous molecules in CVD effluent do not work in TEOS CVD systems. On the contrary, the deposition and build-up in TEOS system effluents are formed primarily by surface chemical reactions between TEOS and water vapor inside the pump line. Neither the TEOS molecules themselves nor the water vapor molecules themselves would cause any build-up in the pump line and would even pass right through the vacuum pump and be exhausted without any problems in the pump line 12 or the equipment if the surface reactions between TEOS and water could be avoided. However, the TEOS molecules are unstable in the presence of water molecules, which hydrolyze the TEOS molecules in a series of slow reactions that produce the SiO$_2$-rich polymerized TEOS depositions and build-up, which can be delayed by the virtual wall apparatus 30 in FIGS. 1 and 2, but not eliminated. The TEOS trap 10 of the present invention therefore encourages such surface reactions of water and TEOS molecules in a disposable medium 70 that creates conditions especially conducive to such reactions.

In a typical pump line, inert molecules, i.e., those that do not react with other atoms or molecules readily, move very rapidly from the furnace outlet 24 to the vacuum pump (less than several seconds) where they are exhausted. If the TEOS molecules and the water vapor molecules would move through the system as fast as inert molecules, the deposition and build-up of silicon dioxide-rich, polymerized TEOS would not be significant, because the hydrolysis of TEOS molecules with the water molecules would be too slow to produce significant solid or liquid polymerized TEOS before being exhausted. However, resident time of TEOS and water molecules in the pump line is actually quite long. Both TEOS and water molecules are very polar, thus they adsorb quite readily on surfaces, especially metal surfaces. Such physical adsorption of both TEOS and water molecules on inner surfaces of the pump line pipes and other component tends to hold them together in the pump line long enough for the slow chemical hydrolysis reactions to proceed to various phases of completion, which produces the silicon dioxide-rich, polymerized TEOS build-up in solid and some liquid phase formations in the pump line. These chemical reactions occur at high temperatures as well as at low temperatures, although the chemical reaction rate, byproducts, and characteristics of the polymerized TEOS materials vary with temperature changes.

As mentioned above, TEOS exhibits excellent thermal stability, but it does start to pyrolyze when it is heated up to 750° C., such as in an LP CVD furnace 14. The pyrolysis (decomposition) of TEOS ($Si(OC_2H_5)_4$) can be described by the following stoichiometric equation:

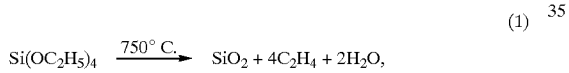
(1)

where $SiO_2$ is one silicon dioxide molecule, $4C_2H_4$ is four ethylene molecules, and $2H_2O$ is two water molecules. These water molecules play an important role in both deposition of thin films 16 of $SiO_2$ on the substrates 18 in the LP CVD furnace 14 as well as in formation of the $SiO_2$-rich, polymerized TEOS build-up in the TEOS trap 10. (In fact, 10 water molecules will be generated if oxygen is used for oxidizing the TEOS molecules at a temperature of higher than 650° C.) However, this gas phase reaction of equation (1) above is not the primary reaction occurring in the furnace 14 to produce the thin films 16 of $SiO_2$. In fact, most of the TEOS molecules are not pyrolized, but are hydrolyzed by the water molecules generated in the pyrolysis reaction of equation (1). This hydrolysis of the TEOS at high temperatures can be expressed as:

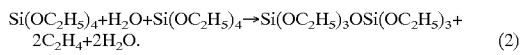
(2)

As shown by equation (2) above, the hydrolysis of two TEOS molecules by one water molecule produced two water molecules along with a polymerized TEOS molecule and two ethylene molecules. Thus, the high temperature hydrolysis of TEOS in the furnace produces a large amount of water molecules, which not only permits a high deposition rate of $SiO_2$ thin films 16 in the furnace, but also results in a large amount of water vapor being transported in the effluent flow 22 into the pump line 12.

From equation (2), it is also clear that two Si—OR bonds, where R is the ethanol alcohol radical $C_2H_5$, can be combined together (polymerized) to form a more stable Si—O—Si bond while releasing two ethylene ($C_2H_4$) and two water molecules simultaneously during the hydrolysis process. When this high temperature hydrolysis of polymerized TEOS is nearly completed, i.e., only a few ethanol alcohol radicals are left in the polymerized TEOS, the polymerized TEOS will solidify and form a good, high quality $SiO_2$ film 16 on the substrates 18.

These same high temperature hydrolysis reactions can form the same hard, dense, polymerized TEOS, and even silicon dioxide, in the furnace outlet 24, because the temperature at the outlet is nearly as high as the temperature inside the furnace 14. Such hard, dense polymerized TEOS build-up in the outlet 24 would not flake and migrate upstream into the furnace 14 to contaminate the thin films 16 being deposited on the substrates 18, but it would have to be removed with a chisel and hammer.

As the temperature in the pump line 12 decreases farther downstream from the furnace outlet 24, the predominate hydrolysis reaction, instead of equation (2), becomes:

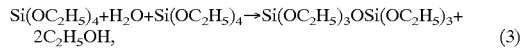
(3)

which consumes, but does not produce new molecules of, water. Larger and larger polymerized TEOS chains are produced by additional hydrolysis reactions, such as:

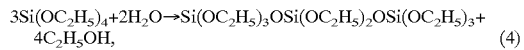
(4)

and:

(5)

and so on for the larger and larger polymerized TEOS molecular chains.

The polymerized TEOS produced by equations (3), (4), (5) and so on at the lower temperatures farther downstream in the pump line 12 is less dense, transparent, and more crystal-like, and it is easier to break. Some of the polymerized TEOS formed at lower temperature is even liquid, at least for a while until further hydrolysis causes it to solidify. The reactions are faster at higher temperatures, but lower temperatures do not necessarily reduce polymerized TEOS build-up. On the contrary, lower temperatures increase adsorption of the TEOS and water molecules on the interior surfaces of the pump line 12, where the slower hydrolysis reactions have ample time to produce the polymerized TEOS solid build-up.

As mentioned above, the boundary layer of virtual wall or apparatus 30 positioned at the furnace outlet 24 and extending downstream from the furnace outlet 24 uses nitrogen ($N_2$) injection to produce a virtual nitrogen ($N_2$) wall around the inside of segmented sleeve 32 in combination with higher temperatures maintained by heater jacket 34 to prevent adsorption of the TEOS and water molecules on the inside surface of the sleeve 32 where they could otherwise hydrolyze over time to produce a polymerized TEOS build-up. Therefore, the gaseous effluent laden with gaseous TEOS and water molecules continues to flow from the furnace outlet 24, through the sleeve 32, and into the TEOS trap 10, as indicated by flow arrows 36, 38, with very little polymerized TEOS deposition or build-up.

The TEOS trap 10, according to the present invention, is designed to selectively impede the flow of TEOS and water molecules in the gaseous effluent long enough for the slow surface hydrolysis reactions to proceed to completion, thereby consuming all the available water vapor in the effluent in solidified or liquified polymerized TEOS, and to retain such solidified or liquified polymerized TEOS in the TEOS trap 10. With all the water molecules consumed by such hydrolysis reactions in the TEOS trap 10, any TEOS molecules remaining in the effluent downstream of the TEOS trap 10 will pass through the vacuum pump and other pump line components harmlessly and without build-up, because, without water molecules, the hydrolysis reactions (3), (4), (5), and so on, that produce solid or liquid polymerized TEOS at low temperatures cannot occur. Therefore, the TEOS trap 10 has a molecular species-selective flow impeding medium 70 positioned in a chamber 60 between the trap inlet 50 and the trap outlet 62, so that the furnace effluent has to flow through the molecular species-selective flow impeding medium 70, as indicated by flow arrows 64, 65, 66, 67, 68, and 69. The primary purpose of the molecular species-selective flow impeding medium 70 according to this invention is to enhance adsorption of the TEOS and water molecules on surfaces, which substantially slows their movement through the pump line 12 and retains them together on such surfaces for long enough times to facilitate and allow the hydrolysis reactions described above to proceed to completion, i.e., to consume substantially all of the water molecules in the lower temperature hydrolysis of TEOS substantially according to equations (3), (4), (5), and so on. Such hydrolysis, as described above, produces polymerized TEOS molecular chains that harden into solid build-up 40 on the molecular species-selective flow impeding medium 70 in the TEOS trap 10 and, to a lesser extent, formation of some liquid phase polymerized TEOS 42. The polymerized TEOS build-up 40 and liquid phase polymerized TEOS 42 effectively consume substantially all of the available water molecules with TEOS molecules, thereby removing them from the effluent stream so that effluent flow downstream from the molecular species-selective flow impeding medium 70, indicated by flow arrows 66, 67, 68, 69 in FIG. 1, is substantially free of water molecules. With no water molecules downstream from the molecular species-selective flow impeding medium 70, any TEOS molecules remaining in the effluent flow 66, 67, 68, 69 cannot be hydrolyzed into polymerized TEOS molecular chains, thus will remain in gaseous form, and will pass through the remainder of the pump line 12, vacuum pump, and other components without solidification or deposition.

To maximize effective TEOS and water molecule flow impedance, i.e., to increase dwell time of TEOS and water molecules in the TEOS trap 10 from the several seconds it would normally take for gaseous molecules to traverse the distance between the trap inlet 50 and the trap outlet 62 to enough time for the hydrolysis reactions of equations (3), (4), (5), and so on, to occur, a molecular species-selective flow impeding medium 70 according to this invention preferably has a combination of features. First, it will have a transverse thickness t with solid surface areas across the transverse thickness t for adsorption of polar molecules, i.e., of TEOS and water molecules. Second, it is preferred, albeit not absolutely necessary, that the medium 70 creates turbulence to break up boundary layers of gas adjacent the surface areas and thereby enhance probability for all the TEOS and water molecules to contact and adsorb on the surfaces so that substantially all the water and TEOS molecules get retained for a sufficient dwell time on surfaces in the medium 70 to promote the surface chemical hydrolysis reactions (3), (4), (5), and so on, described above. Third, while providing the many surface areas and creating the turbulence for the purposes described above, the molecular species-selective flow impeding medium 70 should never-the-less have high flow conductance for non-polar gas molecules in the effluent so as not to inhibit the ability of the vacuum pump to maintain the required vacuum in the furnace 14. Fourth, the molecular species-selective flow impeding medium 70 should also have a large collection capacity to hold substantial volumes of polymerized TEOS build-up 40 without clogging the TEOS filter 10. Finally, cleaning should be quick, easy, and inexpensive, preferably with an easily removable and disposable molecular species-selective flow impeding medium 70.

A molecular species-selective flow impeding medium 70 comprising a transverse thickness t of metal (preferably stainless steel) mesh provides the preferred surface structures and functions described above. Such metal mesh can be formed in a variety of ways with a variety of structures, including, but not limited to, stacked or compounded layers of metal fabric made, for example, with interlaced metal wire or thread or with multiple layers of woven metal screens or expanded metal sheets laminated together or some other material with many tangled or ordered metal micro-surfaces to create the required transverse thickness and surface area density through which the effluent must pass to adsorb substantially all of the water molecules in the effluent along with substantially all of the TEOS molecules required to react with the adsorbed water molecules. The molecule species-selective flow impeding media 70 with the desired transverse thickness t and surface area density can also be provided by myriad configurations of perforated and/or segmented metal foils, although such foil structures are less effective at creating turbulence and at maintaining high conductance for non-adsorbing gases than the meshes. Examples of such mesh and foil flow impeding media 70 are described in more detail below.

Of course, as surface chemical hydrolysis reactions of the adsorbed TEOS and water molecules proceeds as described above, the build-up 40 of the resulting solid polymerized TEOS on the mesh or foil surfaces will begin to clog the molecular species-selective flow impeding medium 70, as illustrated in FIGS. 1 and 2. The initial build-up 40 usually occurs nearest the inlet (59 in FIG. 1, 50 in FIG. 2) of the TEOS trap 10, since the effluent laden with TEOS and water vapor contacts that portion of the molecular species-selective flow impeding medium 70 first. As the build-up 40 clogs the portion of the molecular species-selective flow impeding medium 70 nearest the inlet 59 or 50, the effluent flow naturally moves past such build-up 40 to unclogged portions of the molecular species-selective flow impeding medium 70, as indicated by flow arrows 64, 65 in FIGS. 1 and 2. Of course, as effluent flow 64, 65 shifts farther and farther up the molecular species-selective flow impeding medium 70, the build-up 40 extends gradually farther and farther up the molecular species-selective flow impeding medium 70. Therefore, the molecular species-selective flow impeding medium 70 preferably has sufficient height and diameter to accommodate a large enough volume of build-up 40 such that the reaction furnace 14 can be operated for substantial periods of time before the molecular species-selective flow impeding medium 70 becomes clogged with build-up 40 to an extent that its capacity to adsorb TEOS and water molecules from the effluent is diminished or to an extent that conductance of non-adsorbed gas is diminished. Such height and diameter will, of course, depend on the concentrations of TEOS and water vapor in the effluent and the length of time it is desired to operate the furnace 14 before requiring service. Before the build-up 40 of polymerized TEOS on the molecular species-selective flow impeding medium 70 accumulates to such a volume that it diminishes the capacity of the molecular species-selective flow impeding medium 70 to adsorb TEOS and water molecules or to conduct non-adsorbed gas, the system can be shut down and the clogged or partially clogged molecular species-selective flow impeding medium 70 can be simply removed from the TEOS trap 10 and replaced with a new molecular species-selective flow impeding medium 70. Structures of preferred embodiment selective flow impeding media 70 and of mounting apparatus for the molecular species-selective flow impeding medium 70 in the TEOS trap 10 will be described in more detail below.

The primary stage 11 of the TEOS trap, 10 as illustrated in FIGS. 3–9 is a preferred, substantially cylindrical structure, which will be described in more detail below. However, many other shapes and structures can also be used according to the principles of this invention, which, stated broadly, is any structure that contains a molecular species-selective flow impeding medium between an inlet and an outlet with sufficient transverse thickness and sufficient density of adsorption surfaces to adsorb substantially all of the water vapor in a TEOS reaction furnace effluent along with sufficient TEOS molecules from the effluent to consume substantially all of the adsorbed water molecules in hydrolysis reactions with the TEOS molecules to produce polymerized TEOS molecular chains on the adsorption surfaces.

Referring now to FIGS. 3–9, the preferred embodiment primary stage 11 for a TEOS trap 10 has an elongated, substantially cylindrical housing 80 in the form of a canister that encloses a chamber 60. The inlet end 82 of the housing is enclosed by a removable inlet fitting 50 with an inlet opening 51 and a suitable flange 53 adapted for connection to a pipe fitting in the pump line 12, such as to the T-fitting 52 shown in FIG. 2. With continuing reference to FIGS. 3–8, a suitable flange 84 is affixed to the inlet end 82 of the housing 80 to mate and seal with a similar flange 57 on the inlet fitting 50. A gasket 86 can be positioned between the mating flanges 57, 84 to assist in providing a vacuum-tight seal. Suitable clamps 83, an example of which is illustrated in FIG. 7, or any other suitable fastener can be used to squeeze and retain the two flanges 57, 84 together, as is common and well-known to persons skilled in the art. For the preferred preliminary stage 44 in FIG. 1, the diverging inlet section 59 has the flange 57 for mating with the flange 84 as described above.

The outlet end 88 of housing 80, as shown in FIGS. 3–8, is enclosed by an end wall 90 with an outlet tube 62 that terminates with a suitable pipe fitting flange 92 and having an outlet opening 94.

The preferred, but certainly not necessary, structure of the molecular species-selective flow impeding medium 70 is cylindrical with a height h, transverse thickness t, outer diameter D, and inner diameter d (see FIG. 8). A bracket 100 for mounting the molecular species-selective flow impeding medium 70 in the housing 80 comprises a U-shaped guide 102 affixed to diametrically opposite sides of the inside surface of the outlet tube 62 and/or to the end plate 90 and has a width that is approximately equal to, or slightly smaller than, the inside diameter d of the molecular species-selective flow impeding medium 70. The bracket 100 also comprises an elongated rod 104 extending from a proximal end 106 downwardly from the guide strap 102 and terminates at a threaded distal end 108 near the inlet end 82 of the housing 80. The upper end 71 of the molecular species-selective flow impeding medium 70 slips around the guide strap 102, which centers and retains the molecular species-selective flow impeding medium 70 laterally in the housing 80, and abuts the end wall 90. A retainer plate 110 mounts on the distal end 108 of rod and bears on the lower end 72 of the molecular species-selective flow impeding medium 70, where it is tightened and retained in place by a wing nut 112 screwed onto the threaded distal end of rod 104. Therefore, the molecular species-selective flow impeding medium 70 is held in place vertically by the end wall 90 and the retainer plate 110, while it is centered and held in place laterally by the guide 102. The guide 102 is preferably a U-shaped strap, as best seen in FIGS. 3, 5, and 9, or other structure that does not occlude the outlet opening 94 of the TEOS trap 10.

To remove the molecular species-selective flow impeding medium 70, such as when it is clogged with polymerized TEOS build-up 40, the TEOS trap 10 is first removed from the pump line 12 (see FIGS. 1 and 2). Then, the clamps 83 are removed, so the inlet fitting (59 in FIG. 1, 50 in FIG. 2) can be removed from the inlet end 82 of the housing 80 (see FIG. 8). Next, the wing nut 112 and retainer plate 110 are removed, so the molecular species-selective flow impeding medium 70 can be slid off the guide 102 and removed from the chamber 60. A new molecular species-selective flow impeding medium 70 can be installed by reversing this procedure.

It goes without saying that the terms "upper" and "lower" or "top" and "bottom" as used in this description are for convenience only. The "upper" and "lower" or "top" and "bottom" are in reference to the preferred vertical mounting orientation of the TEOS trap 10 illustrated in FIGS. 1, 3, and 7. Obviously, the TEOS trap 10, particularly the primary stage 11 of the TEOS trap 10, can also be used in other mounting positions, such as horizontal, upside down, or any position in between, without changing the substance of this invention.

Most of the build-up 40 of polymerized TEOS will occur on the micro-surfaces 73 in the transverse thickness t between the upstream surface 75 and the downstream surface 76 of the molecular species-selective flow impeding medium 70. However, some amount of the build-up 40 may also extend radially outward from the upstream surface 75. Therefore, the housing 80 and the molecular species-selective flow impeding medium 70 should be sized to leave a sufficiently wide annular space 61 between the molecular species-selective flow impeding medium 70 and the housing 80 so that effluent flow, as indicated by flow arrows 64, 65 in FIG. 1, can continue unimpeded by the build-up 40 near the inlet end 82 of the housing 80. For example, but not for limitation, a housing 80 with an inside diameter of about 15 cm. and a molecular species-selective flow impeding medium 70 with an outside diameter D of about 13 cm. is satisfactory for this purpose. The core space 63 sizing is not critical, since substantially all water vapor should be removed from the effluent in polymerized TEOS build-up 40 in the molecular species-selective flow impeding medium 70, thus no longer available to hydrolyze and polymerize TEOS molecules downstream from the molecular species-selective flow impeding medium 70. Therefore, a core size 63 defined by the inside diameter d of the molecular species-selective flow impeding medium 70 approximately equal to the diameter of the outlet opening 94, which can be sized to correspond to downstream piping to the vacuum pump, for example about 7.3 cm., is appropriate.

As discussed briefly above, the molecular species-selective flow impeding medium 70, according to this invention, has a thickness t comprising a sufficient density of microsurfaces 73 to adsorb substantially all the water molecules and enough TEOS molecules from the effluent to consume substantially all the water molecules in hydrolysis reactions that produce solid or liquid polymerized TEOS molecular chains on the microsurfaces. At the same time, the microsurfaces 73 are not so dense as to inhibit the ability of the vacuum pump to maintain the required vacuum in the reaction furnace 14. In other words, gas molecules in the effluent that are substantially non-polar, such as ethylene ($C_2H_4$), helium (He2), or nitrogen (N2), thus do not adsorb on the microsurfaces 73, should be able to pass substantially unimpeded through the molecular species-selective flow impeding medium 70.

A preferred embodiment of the molecular species-selective flow impeding medium 70 comprises a mesh 74 of multiple layers of crimped metal fabric made with intertwined or interlaced metal wire to form a maze or tangle of metal micro-surfaces 73, as illustrated by the molecular species-selective flow impeding medium 70 in FIGS. 1–9 and in more detail in the enlarged section of such a molecular species-selective flow impeding medium 70 in FIG. 10, and the even more enlarged view in FIG. 11 of a metal wire segment 78 of the mesh 74.

As shown in FIG. 10, the mesh 74 that forms the preferred embodiment molecular species-selective flow impeding medium 70 is comprised of a loose tangle of intertwined or interlaced metal wires 78. The word "tangle" as used herein does not imply that the wires are not assembled or laced in an ordered manner or pattern, but only that they are shaped and positioned in a manner that substantially prevents gas from flowing straight through the medium 70 without changing course or direction. As illustrated by the exemplary segment of one of the wires 78 in FIG. 11, each of the wires has a surface 73, which is called a micro-surface 73 in this description to distinguish surfaces 73 of the wires 78 from the overall upstream surface or side 75 and downstream surface or side 76 of the molecular species-selective flow impeding medium 70. The transverse thickness t of the molecular species-selective flow impeding medium is defined by the nominal distance between the upstream surface or side 75 and the downstream surface or side 76, but there are many wire 78 segments with many microsurfaces 73 in the transverse thickness t of mesh 74 between the upstream surface or side 75 and the downstream surface or side 76. The heavier gauge wire screen 79 on the downstream side 76 provides a rigid frame on which the mesh 74 is mounted and supported. The screen frame 79 in the preferred embodiment molecular species-selective flow impeding medium 70 shown in FIGS. 3–9 is cylindrical with the mesh 74 mounted on the screen frame 79 in a cylindrical shape that is positioned in the chamber 63 of the primary stage 11 of then TEOS trap 10 as described above.

As indicated by the flow arrows 64, 65 in FIGS. 1 and 2 and by the flow arrow 66 in FIGS. 1, 2, and 10, the effluent flow from the furnace 14 laden with TEOS and water vapor is directed through the molecular species-selective flow impeding medium 70, where the TEOS and water molecules are retained long enough to react and polymerize into solid and liquid phases 40, 42 that are retained by the TEOS trap 10 so that such TEOS polymerization is prevented from occurring farther downstream toward the vacuum pump. As explained above, the TEOS polymerization occurs by hydrolysis in slow chemical reactions on micro-surfaces 73 of the metal wires 78 that form the mesh 74. To promote these slow hydrolysis reactions in the medium 70, the gaseous TEOS and water vapor molecules have to be retained in close proximity to each other for longer times than that would occur in an unimpeded gas flow through the pump line 12 (FIG. 1). Therefore, to prevent formation of solid and liquid phase TEOS polymers on surfaces downstream from the TEOS trap 10 where they can cause expensive damage and disruptions, there has to be enough micro-surface area 73 in the transverse thickness t of the medium 70 to capture, retain, and allow consumption of substantially all the water molecules in the effluent flow 66 in hydrolysis reactions that form solid and liquid TEOS polymers along with whatever TEOS molecules that are required for such hydrolysis consumption and resulting polymerization. Stripped of the water molecules, the effluent emerging from the medium 70 cannot form further solid or liquid phase TEOS polymers that could damage downstream components, even if substantial TEOS molecules remain in the effluent.

As explained briefly above, the micro-surfaces 73 of the metal wires 78 in the mesh 74 adsorb and retain TEOS and water molecules, both of which are polar, thus conducive to such adsorption, while non-polar molecules, such as the ethylene byproduct of the hydrolysis reactions described above as well as helium, nitrogen, and other non-polar dilution or carrier gases, pass substantially unimpeded through the medium 70. In the preferred embodiment molecular species-selective flow impeding medium 70, the tangle of wires 78 through which the effluent must flow creates a turbulence that tends to break down or disrupt gaseous boundary layers adjacent the micro-surfaces 73, which increases substantially the probability that TEOS and water molecules will contact and be adsorbed on the micro-surfaces 73. At the same time, the tangle of wires 78 provides enough micro-surface 73 area in the transverse thickness t between the upstream surface 75 and downstream surface 76 so that substantially all the water molecules and enough TEOS molecules are not only adsorbed, but also retained on the micro-surface 73 for long enough periods of time to accommodate the progression of hydrolysis reactions to create the solid and liquid phase TEOS polymers. Insufficient micro-surface 73 would not only be incapable of adsorbing enough water and TEOS molecules, but would not retain adsorbed water and TEOS molecules long enough for the hydrolysis reactions (2), (3), (4), and so on, to proceed to solid or liquid phase TEOS polymers before desorbing back into the effluent flow. Of course, too many microsurfaces 73 in the thickness t of the medium would impede flow of non-polar gaseous molecules, thus interfere with the ability of the vacuum pump to maintain the required vacuum in the furnace, as described above. Therefore, as explained above, a significant feature of this invention is adsorbing and retaining TEOS and water molecules from the effluent on adsorption surfaces 73 long enough to consume substantially all of the water molecules in TEOS hydrolysis reactions while allowing non-hydrolyzed TEOS molecules and ethylene molecules to continue flowing in the effluent and retaining solid and/or liquid phase TEOS polymers formed by the hydrolysis reactions in the trap 10.

Accordingly, a significant feature of this invention is to place enough wire 78 in the mesh 74 to provide a micro-surface 73 density (Surface Area/Unit Volume) in a range of about 2.50 $in^2/in^3$ to 13.5 $in^2/in^3$ (1.0 $cm^2/cm^3$ to 5.4 $cm^2/cm^3$), preferably about 6.5 $in^2/in^3$ (2.6 $cm^2/cm^3$). In other words, in each cubic-inch volume of mesh 74, there is about 2.5 $in^2$ to 13.5 $in^2$, preferably about 6.5 $in^2$, of micro-surface 73 area. The micro-surface 73 area $A_s$ for cylindrical wire 78 in the mesh 74, as shown in FIG. 11, can be determined by the formula:

$$A_s = \pi \times dia. \times l \tag{6}$$

where (dia.) is the diameter of the wire 78 and l is the length of wire 78 in a volume of mesh 74.

To create sufficient turbulence with the micro-surface area $A_s$ density ranges described above, it is preferred to use mesh 74 comprised of wire 78 with a diameter (dia.) in a range of about 0.007 in. to 0.015 in. (180 microns to 380 microns), and more preferably about 0.011 in. (280 microns). Stainless steel wire 78 is preferred, but other common metals, such as copper, bronze, and aluminum would also provide satisfactory adsorption of water and TEOS molecules, as would ceramic strands or threads in a mesh 74. While wire 78 with circular cross-section is preferred, mostly because of its availability, strips of wire 78 with flat or other cross-sections could be used to provide the micro-surface density within the range described above.

An example of a single layer of crimped wire fabric 120 is shown in FIG. 12, wherein strands of the wire 78 are interlaced to form the open, single layer metal fabric 120. More micro-surface 73 density can be added by stacking or laminating multiple layers of such metal fabric 120 together, as shown in FIG. 13. Even greater micro-surface 73 density, as illustrated in FIG. 14, by stacking or laminating four layers metal fabric 120 layers together.

The preferred embodiment mesh 74 for the molecular species-selective flow impeding medium 70 can, therefore, be fabricated quite easily by stacking together layers of the metal fabric 120 until the desired micro-surface 73 density is attained. For example, but not for limitation, a long strip of the metal fabric 120 can be folded over on itself, as shown in FIG. 15, to create a double density stack similar to that shown in FIG. 13. The metal fabric 120 can also be crimped to add some three-dimensional depth to the fabric 120, as indicated by the crimped convex and concave bends 121, 122, respectively, in FIG. 15. Further, when the crimped bends 121, 122 are formed diagonally, as shown in FIG. 15, the concave bends 122 of the top layer 123 bridge against the concave bends 122 of the bottom layer 124 to maintain the three-dimensional depth of the composite of the two layers 123, 124, which creates a lesser micro-surface density than if the two metal fabric layers were not crimped. It follows, therefore, that the micro-surface density of the composite mesh 74 can be a function of the sharpness or depth from convex bends 121 to adjacent concave bends 122. The folded composite metal fabric 120 of FIG. 15, can then be rolled as illustrated in FIG. 16 as many turns as necessary to make the desired thickness t of the mesh 74 molecular species-selective flow impeding medium 70 of FIGS. 3, 8, and 10 as described above. Of course, the finished medium 70 may have the metal fabric 120 wrapped more tightly than shown in FIG. 16 and is preferably wrapped around a stiff, heavy gauge screen frame 79, as described above and shown in FIGS. 3, 8, and 10. However, the wrap of metal fabric 120 in FIG. 16 illustrates one method and structure for fabricating a molecular species-selective flow impeding medium 70 according to this invention.

An example preferred size molecular species-selective flow impeding medium according to this invention can be cylindrical in shape, as shown in FIGS. 3, 8, and 9, with a height h in a range of about 6–20 inches, preferably about 8.5 inches, an outside diameter D in a range of about 3–6 inches, preferably about 4.8 inches, and an inside diameter d in a range of about 2–5 inches, preferably about 2.9 inches. Such medium 70 sizing provides a thickness t in a range of about 0.5–2 inches, preferably about 1 inch, which, with a micro-surface density in the range described above, provides the adsorption capacity for water and TEOS molecules, conductance of non-polar molecules and sufficient build-up 40 capacity for TEOS polymers to prevent downstream TEOS polymer formation for effluent from typical $SiO_2$ deposition furnaces for enough operation time to be very efficient and economical.

An alternative structure molecular species-selective flow impeding medium 70 is shown in FIG. 17, wherein the wire micro-surfaces of the medium are provided by multiple layers 130, 131, 132, 133, 134, and 135 of metal screen. The screen can be woven wire, as shown in FIG. 17, or it can be expanded metal (metal stamped with staggered cuts or slits and then stretched), or any other screen structure. Screen wire size and spacing of layers 130, 131, 132, 133, 134, and 135 can be selected to provide the preferred micro-surface density described above.

While the preferred medium 70 comprises wire micro-surfaces 73 provided by the intertwined or interlaced wire fabric 120 mesh 74 described above, by the screen layers 130–135 described above, or by some other metal wire or thread medium, other metal structures can also be used to form the metal surfaces required for the molecular species-selective flow impeding medium 70 of this invention. For example, metal foil, preferably, but not essentially, stainless steel metal foil, can also be used. Strips of shredded metal foil, similar to the metal foil strips commonly used as tinsel or "icicle" decorations, crumpled and bunched together (not shown) to create a micro-surface density within the desired range described above can function as an effective molecular species-selective flow impeding medium 70 for purposes of this invention.

While not as preferred as the medium 70 structures described above, metal foil sheet surfaces can also provide the molecular species-selective flow impeding function of the medium 70 according to this invention. For example, the medium 70 can compromise multiple concentric layers 141, 142, 143, 144 of perforated foil 140 provides surface area 145 on each layer that can adsorb and retain TEOS and water molecules, while passing ethylene, helium, nitrogen, and other non-polar molecules through the holes 146 perforated through the foil sheets 140. The perforation 146 sizes and densities on each sheet 140 as well as the radial number of layers and the spacing between layers 141, 142, 143, 144 can be selected to provide surface area 146 density (Area/Unit Volume) within the preferred surface or micro-surface density range described above. However, turbulence to break boundary layers of gas flow adjacent the surfaces are more difficult to attain than with the meshes described above. The number of multiple layers 141, 142, 143, 144 shown is illustrative only, and this invention is not limited to that number.

Another perforated metal foil medium 70 is shown in FIG. 19. In this embodiment, the metal foil 150 is folded into a fan pattern and formed into a cylindrical molecular species-selective flow impeding medium 70. The upstream surfaces 152, 153 and downstream surfaces 154, 155 of folds 151 provide the adsorption surfaces required to adsorb and retain TEOS and water molecules for the hydrolysis reactions described above, while the ethylene, helium, nitrogen, and other non-polar molecules pass through the holes 156 perforated in the foil 150. Again, creating and sustaining boundary layer breaking turbulences is not as effective with this foil and embodiment as with the mesh embodiments described above.

In another metal foil medium 70, a plurality of elongated foil leaves 160 are held in position with opposite surfaces 161, 162 extending radially in a cylindrical shape by wires 163, 164. Again, while the surface 161, 162 to provide the TEOS and water molecule adsorption function, as ethylene and other non-polar gaseous molecules pass between the leaves 160, laminar, non-turbulent gas flow with the consequent boundary layers adjacent the surface 161, 162 make the adsorption less effective in this embodiment than in the mesh embodiments described above.

Some existing reaction furnace installations do not have much room for installation of an after-market TEOS trap 10. In such circumstances, modifications can be made. For example, as illustrated in FIG. 21, the primary stage 11 of the TEOS trap 10 can be connected directly to the outlet 24 of the furnace 14. While such installation is not as desirable as that shown in FIGS. 1 and 2 with the preliminary stage 44, 52, primarily due to not having the extra capacity provided by the preliminary stage 44, 52, such installations as that illustrated in FIGS. 21 are still very effective at TEOS polymer control and removal.

Another embodiment of the TEOS trap 10 for installations where space is tight is illustrated in FIG. 22. In this embodiment, the housing 80' is modified to provide a horizontal inlet 51' opening transversely into the annular chamber 60. The inlet fitting 50' can be equipped with a standard pipe flange 53' for connection to a furnace outlet 24 (FIG. 1) or to another pump line component, such as to the pipe 31 containing the virtual wall apparatus 30 in FIG. 2. The molecular species-selective flow impeding medium 70 can be the same as described above, and the guide strap 102 adjacent the trap outlet 62 can also be the same as described above. The inlet fitting 50' can include an enlarged portion 81' of the housing 80 can be provided for additional capacity so that the cross-sectional area of the flow path is increased and build-up of SiO$_2$-rich TEOS polymer (not shown) on the medium 70 directly adjacent the inlet 50' will not clog the inlet 50' or the annular chamber 60 near the inlet 50' before other portions of the medium 70 can be utilized fully. The bottom end 72 of the medium 70 is mounted on a shoulder 171 of an end cap 170, which is connected by a flange 172 to the lower flange 84 of the trap housing 80', such as by a clamp (not shown in FIG. 22, but shown at 83 in FIG. 8). When the end cap 170 is removed, which can be facilitated by a handle 173 for grasping and pulling the end cap 170, the medium 70 can be removed and replaced, as described above.

There are, of course, many other structures and materials and combinations of structures and materials that can be used to provide adsorption surfaces in molecular species-selective flow impeding media for TEOS traps according to this invention. As described above, those with adoption surface density in the desired range and that create turbulence in the effluent gas flowing through the medium are the most effective for purposes of this invention.

The foregoing description is considered as illustrative only of the principles of the invention. The words "comprise," "comprising," "include," "including," and "includes" when used in this specification and in the following claims are intended to specify the presence of stated features, integers, components, or steps, but they do not preclude the presence or addition of one or more other features, integers, components, steps, or groups thereof. Furthermore, since a number modifications and changes will readily occur to those skilled in the art, it is not desired to limit the invention to the exact construction and process shown described above. Accordingly, all suitable modifications and equivalents may be resorted to falling within the scope of the invention as defined by the claims which follow.

The embodiments of the invention in which an exclusive property or privilege is claimed which follow:

1. A method of controlling build-up of polymerized TEOS in a vacuum pump line carrying effluent laden with TEOS, water, and ethylene byproducts of TEOS CVD of SiO$_2$ films, comprising:

adsorbing and retaining TEOS and water molecules from the effluent on adsorption surfaces in a trap for long enough dwell time to consume substantially all of the water molecules in TEOS hydrolysis reactions while allowing non-hydrolyzed TEOS molecules and ethylene molecules to continue flowing in the effluent and retaining solid and/or liquid phase TEOS polymers formed by the hydrolysis reactions on the absorption surfaces in the trap.

2. A method of preventing build-up of TEOS polymers in a pump line or in components in a pump line downstream from a reaction furnace from which gaseous effluent laden with TEOS, water, ethylene, and other molecules are exhausted from said reaction furnace, comprising:

flowing said effluent through molecular species-selective flow impeding medium comprising multiple micro-surfaces of materials that is adsorbent to polar TEOS and water molecules and not adsorbent to non-polar ethylene and other non-polar molecules; and retaining adsorbed water molecules and TEOS molecules together on said surfaces for a sufficient time to hydrolyze said TEOS molecules adsorbed on said surfaces to a sufficient degree to form solid and/or liquid phase TEOS polymers.

3. A method of claim 2, including flowing said effluent through a volume of molecular species-selective flow impeding medium that has a micro-surface density (Surface Area/Unit Volume) in said volume in a range of about 2.5 to 13.5 in$^2$/in$^3$.

4. A method of claim 2, including flowing said effluent through a volume of molecular species-selective flow impeding medium that comprises a plurality of metal micro-surfaces in a micro-surface density (Surface Area/Unit Volume) in a range of about 2.5 to 13.5 in$^2$/in$^3$.

5. The method of claim 2, including flowing the effluent through enough of the molecular species-selective flow impeding material with sufficient micro surface density (Surface Area/Unit Volume) to adsorb and retain substantially all of the water molecules and enough of the TEOS molecules in the effluent for a long enough dwell time for the hydrolysis reactions to consume substantially all of said water molecules in forming said solid and/or liquid phase polymers.

6. The method of claim 2, including selectively impeding flow of the TEOS and water molecules in the gaseous effluent long enough for slow surface hydrolysis reactions to proceed to completion, thereby consuming all available water molecules in the effluent during formation of said solid and/or liquid phase TEOS polymers.

7. The method of claim 6, including retaining said solid and/or liquid phase TEOS polymers in said flow impeding medium.

8. The method of claim 6, including allowing any TEOS molecules that are not hydrolyzed into said solid and/or liquid phase TEOS molecules to remain along with said ethylene and other non-polar molecules in said gaseous effluent.

9. The method of claim 2, including creating turbulence in said effluent flowing through said molecular species-selective flow impeding medium to break up boundary layers of gas adjacent said micro surfaces and thereby enhance probability for all the TEOS and water molecules to contact and adsorb on said micro surfaces to that substantially all the water and TEOS molecules get retained for said sufficient time.

10. The method of claim 2, including disposing of said solid and/or liquid phase TEOS polymers by removing and disposing of said molecular species-selective flow impeding medium.

* * * * *